(12) United States Patent
Ooga et al.

(10) Patent No.: US 11,044,807 B2
(45) Date of Patent: Jun. 22, 2021

(54) POLYURETHANE, CURABLE COMPOSITION, OVERCOAT FILM, AND FLEXIBLE WIRING BOARD AND PRODUCTION METHOD THEREFOR

(71) Applicant: NIPPON POLYTECH CORP., Hachioji (JP)

(72) Inventors: Kazuhiko Ooga, Tokyo (JP); Naoki Murata, Tokyo (JP); Kai Suzuki, Tokyo (JP)

(73) Assignee: NIPPON POLYTECH CORP., Tokyo (JP)

( * ) Notice: Subject to any disclaimer, the term of this patent is extended or adjusted under 35 U.S.C. 154(b) by 119 days.

(21) Appl. No.: 16/061,036

(22) PCT Filed: Dec. 13, 2016

(86) PCT No.: PCT/JP2016/087103
§ 371 (c)(1),
(2) Date: Jun. 11, 2018

(87) PCT Pub. No.: WO2017/110591
PCT Pub. Date: Jun. 29, 2017

(65) Prior Publication Data
US 2018/0368253 A1 Dec. 20, 2018

(30) Foreign Application Priority Data
Dec. 25, 2015 (JP) .............................. JP2015-254983

(51) Int. Cl.
C08G 18/42 (2006.01)
C08G 18/32 (2006.01)
(Continued)

(52) U.S. Cl.
CPC ............. *H05K 1/0271* (2013.01); *B05D 7/00* (2013.01); *B05D 7/24* (2013.01); *B32B 15/08* (2013.01);
(Continued)

(58) Field of Classification Search
CPC ............ C08G 18/3215; C08G 18/4211; C08G 18/4213; C08G 18/0823; C08G 18/6659;
(Continued)

(56) References Cited

U.S. PATENT DOCUMENTS 5,389,718 A * 2/1995 Potter ................ C08G 18/0819
524/591
5,972,158 A 10/1999 Hoffmann et al.
(Continued)

FOREIGN PATENT DOCUMENTS

JP 08-003260 A 1/1996
JP 09-510250 A 10/1997
(Continued)

OTHER PUBLICATIONS

WO-2013046889_04-2013_English Translation.*
(Continued)

*Primary Examiner* — Michael L Leonard
(74) *Attorney, Agent, or Firm* — Birch, Stewart, Kolasch & Birch, LLP

(57) ABSTRACT

Provided are a polyurethane and a curable composition capable of obtaining an overcoat film for a flexible wiring board that is excellent in low-warpage properties, flexibility, long-term insulation reliability, and wiring disconnection preventing properties. The polyurethane has: a structural unit of formula (1) (in formula (1), an n-number of $R^1$ each independently represents a 1,2-phenylene group or a 1,2-phenylene group having a substituent, an (n+1)-number of
(Continued)

$^1$H-NMR SPECTRUM OF POLYURETHANE U1 OBTAINED IN SYNTHESIS EXAMPLE 1 (SOLVENT:CDCl$_3$)

R² each independently represents a hydrocarbon group having 3-9 carbon atoms, and n represents an integer from 1 to 50); a structural unit of formula (2) (in formula (2). R³ represents a divalent organic group having 6-14 carbon atoms); and a structural unit of formula (3) (in formula (3), R³ represents a divalent organic group having 6-14 carbon atoms, and R⁴ represents a methyl or ethyl group).

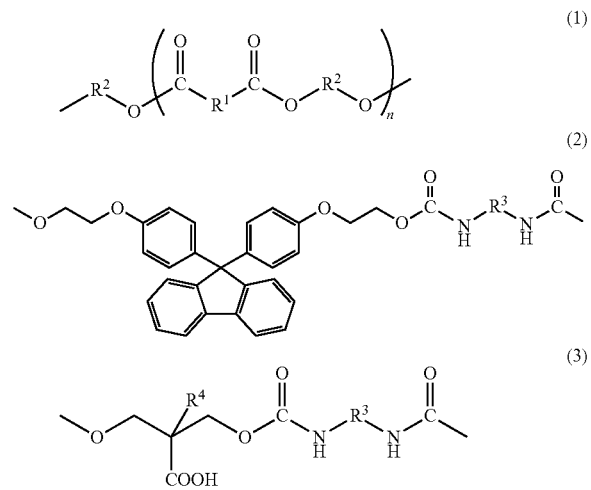

19 Claims, 6 Drawing Sheets

(51) Int. Cl.

| | | |
|---|---|---|
| H05K 1/02 | (2006.01) |
| C08K 3/26 | (2006.01) |
| C08K 3/36 | (2006.01) |
| C08G 18/08 | (2006.01) |
| C08L 75/06 | (2006.01) |
| C08G 18/28 | (2006.01) |
| C09D 175/04 | (2006.01) |
| C08G 59/40 | (2006.01) |
| B05D 7/00 | (2006.01) |
| C09D 7/40 | (2018.01) |
| H05K 3/28 | (2006.01) |
| C08G 18/75 | (2006.01) |
| B05D 7/24 | (2006.01) |
| B32B 15/08 | (2006.01) |
| B41M 3/00 | (2006.01) |
| B41M 7/00 | (2006.01) |
| C08G 18/34 | (2006.01) |
| C08G 18/66 | (2006.01) |
| C09D 11/037 | (2014.01) |
| C09D 11/102 | (2014.01) |
| H05K 1/03 | (2006.01) |
| H05K 1/09 | (2006.01) |
| C08K 3/22 | (2006.01) |

(52) U.S. Cl.
CPC .......... *B41M 3/006* (2013.01); *B41M 7/009* (2013.01); *C08G 18/0823* (2013.01); *C08G 18/282* (2013.01); *C08G 18/3215* (2013.01); *C08G 18/348* (2013.01); *C08G 18/4211* (2013.01); *C08G 18/4213* (2013.01); *C08G 18/6659* (2013.01); *C08G 18/755* (2013.01); *C08G 18/758* (2013.01); *C08G 59/40* (2013.01); *C08K 3/26* (2013.01); *C08K 3/36* (2013.01); *C08L 75/06* (2013.01); *C09D 7/40* (2018.01); *C09D 11/037* (2013.01); *C09D 11/102* (2013.01); *C09D 175/04* (2013.01); *H05K 1/028* (2013.01); *H05K 1/0353* (2013.01); *H05K 1/09* (2013.01); *H05K 3/28* (2013.01); *H05K 3/285* (2013.01); *C08K 2003/222* (2013.01); *C08K 2003/2227* (2013.01); *C08K 2003/267* (2013.01); *H05K 2203/1305* (2013.01)

(58) Field of Classification Search
CPC .. C08G 18/755; C08G 18/758; H01K 1/0271; B05D 7/00; B05D 7/24; B32B 15/08; B41M 3/006; B41M 7/009
See application file for complete search history.

(56) References Cited

U.S. PATENT DOCUMENTS

| | | |
|---|---|---|
| 2009/0082518 A1 | 3/2009 | Uchida et al. |
| 2009/0099283 A1 | 4/2009 | Ishihara et al. |
| 2011/0081495 A1 | 4/2011 | Hayashi et al. |
| 2011/0279759 A1 | 11/2011 | Nagata et al. |
| 2012/0217045 A1 | 8/2012 | Hukushima et al. |

FOREIGN PATENT DOCUMENTS

| | | | |
|---|---|---|---|
| JP | 11-209454 A | 8/1999 | |
| JP | 11-255859 A | 9/1999 | |
| JP | 11-279252 A | 10/1999 | |
| JP | 2004-182792 A | 7/2004 | |
| JP | 2006-348278 A | 12/2006 | |
| JP | 2008-045032 A | 2/2008 | |
| JP | 2008-506830 A | 3/2008 | |
| JP | 2008-101160 A | 5/2008 | |
| JP | 2008-201877 A | 9/2008 | |
| JP | 2009-280686 A | 12/2009 | |
| JP | 2014-177621 A | 9/2014 | |
| JP | 2014177621 A * | 9/2014 | |
| JP | 2014-189746 A | 10/2014 | |
| JP | 2014-196411 A | 10/2014 | |
| KR | 10-2012-0059616 A | 6/2012 | |
| TW | 201443152 A | 11/2014 | |
| WO | 2006/009351 A1 | 1/2006 | |
| WO | WO-2006033439 A1 * | 3/2006 | ........... C08G 18/672 |
| WO | 2007/105713 A1 | 9/2007 | |
| WO | 2009/151018 A1 | 12/2009 | |
| WO | 2010/098327 A1 | 9/2010 | |
| WO | WO-2013046889 A1 * | 4/2013 | ............. B32B 27/06 |

OTHER PUBLICATIONS

JP-2014177621-A, Sep. 2014. English Translation.*
International Search Report of PCT/JP2016/087103 dated Mar. 21, 2017.

* cited by examiner

¹H-NMR SPECTRUM OF POLYURETHANE U1 OBTAINED IN SYNTHESIS EXAMPLE 1 (SOLVENT: CDCl₃)

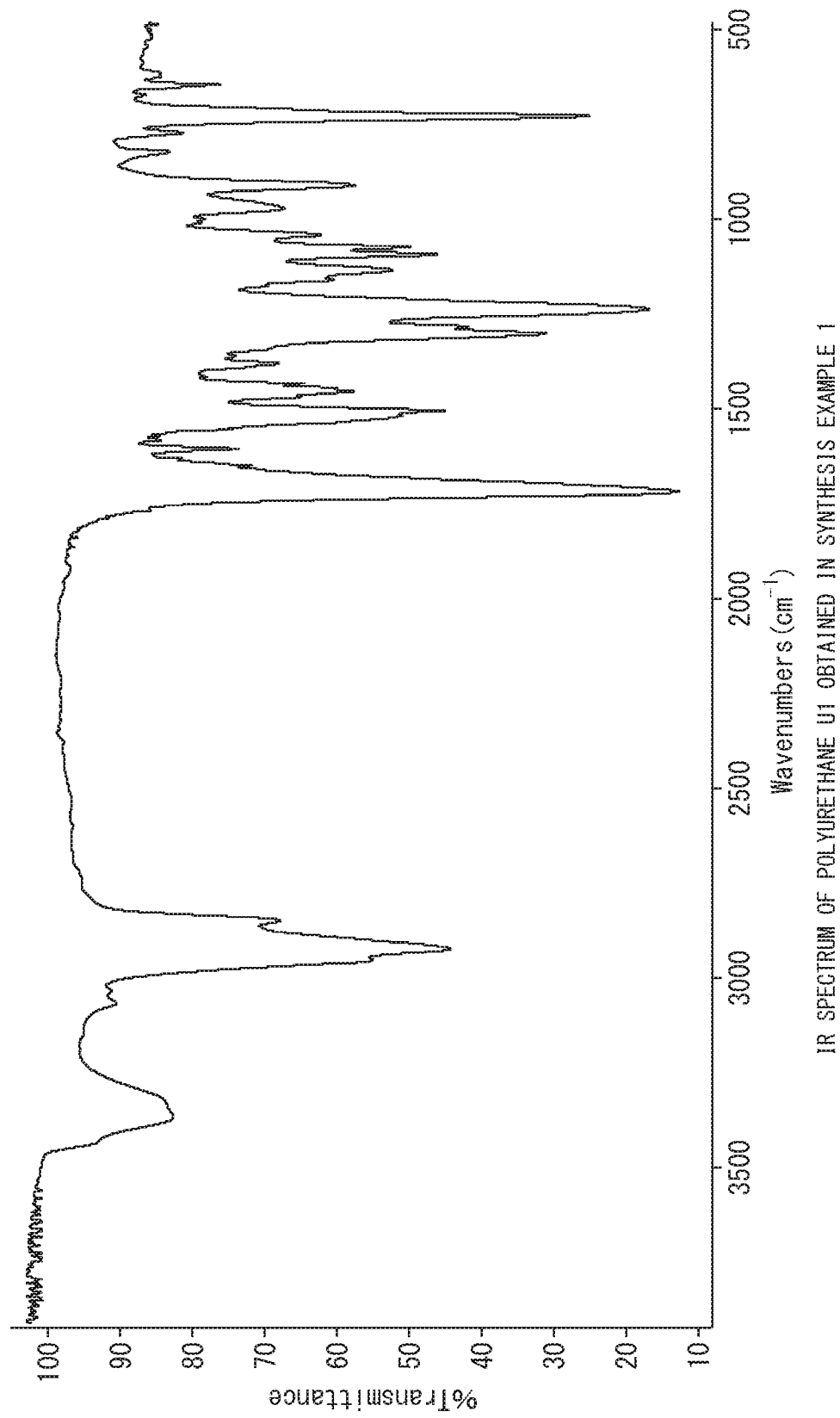

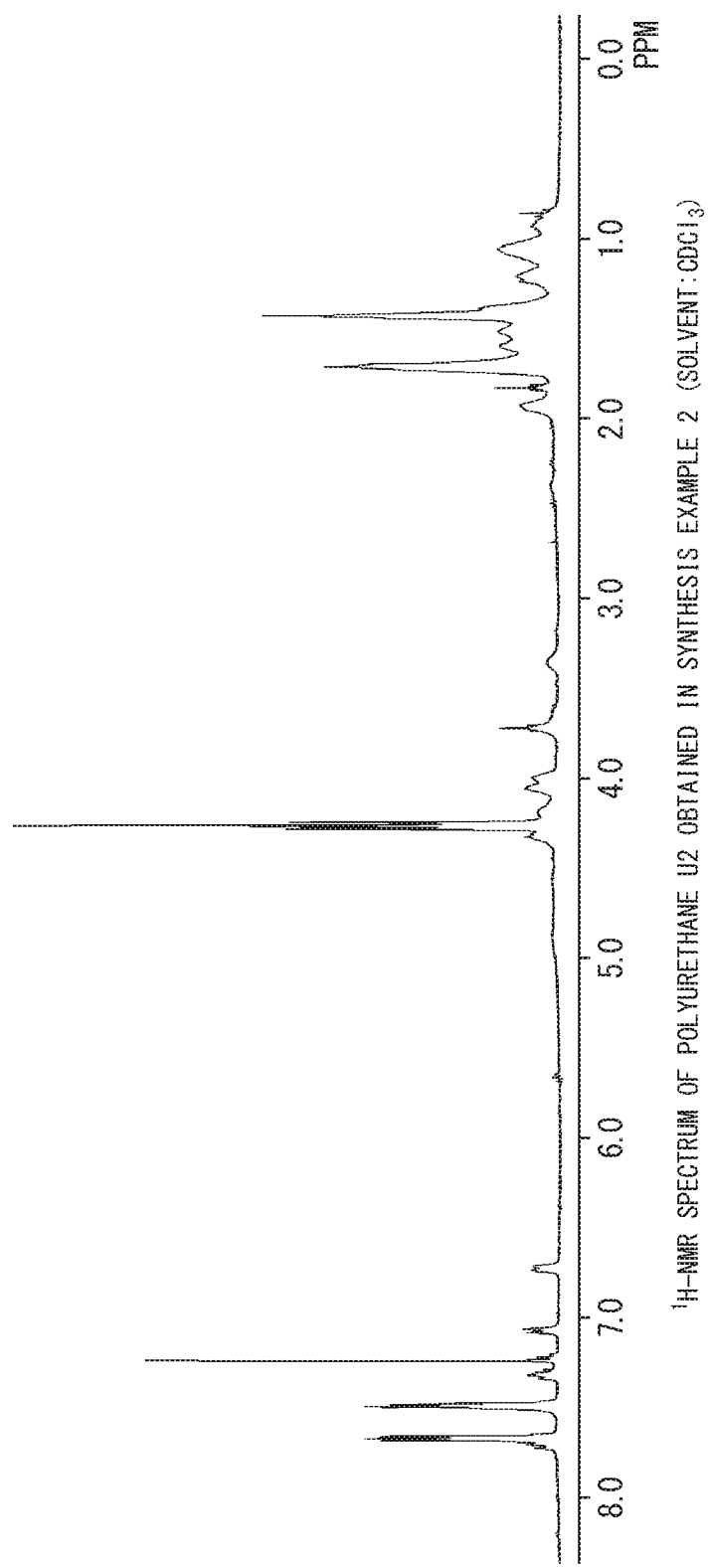

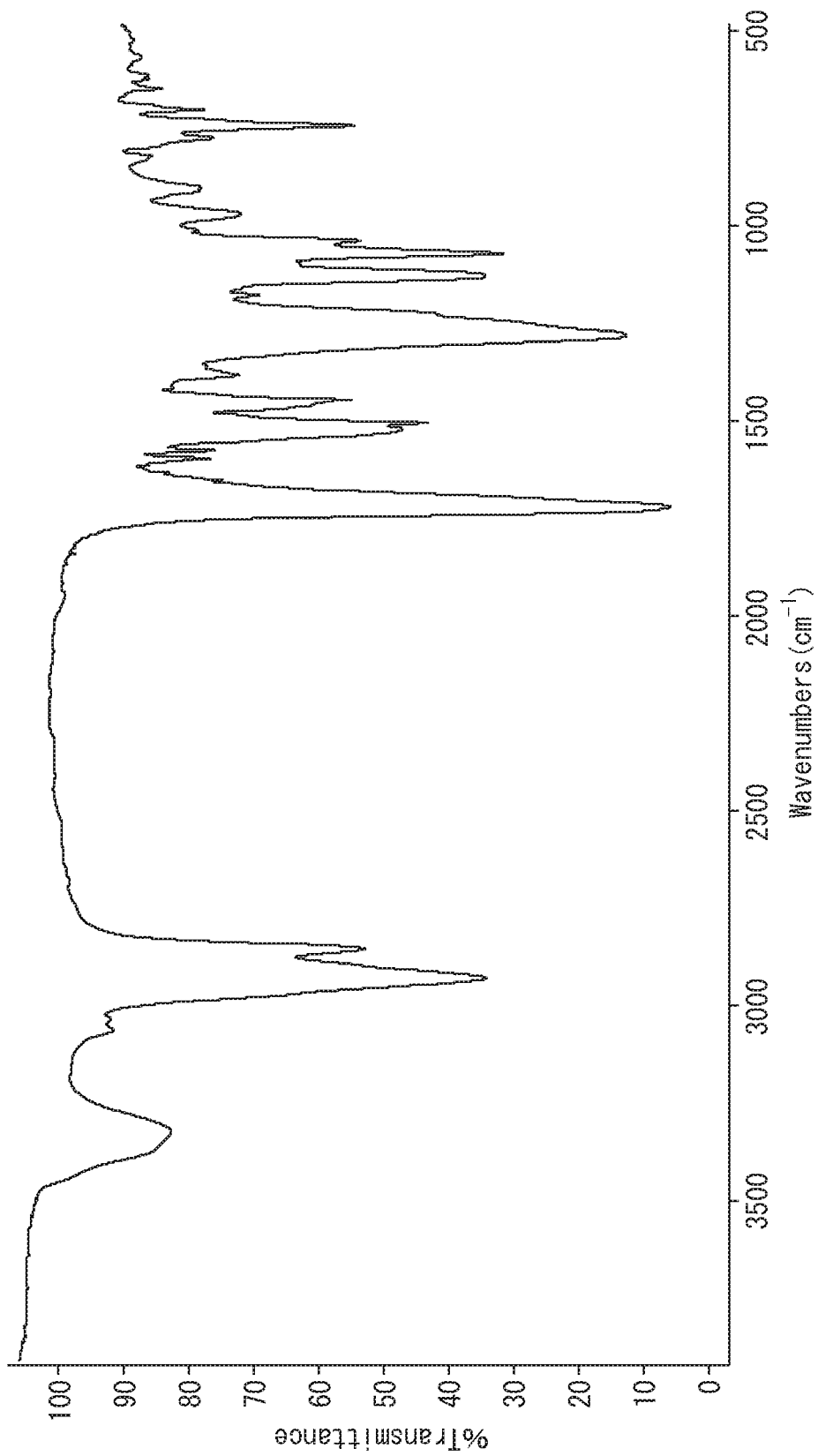

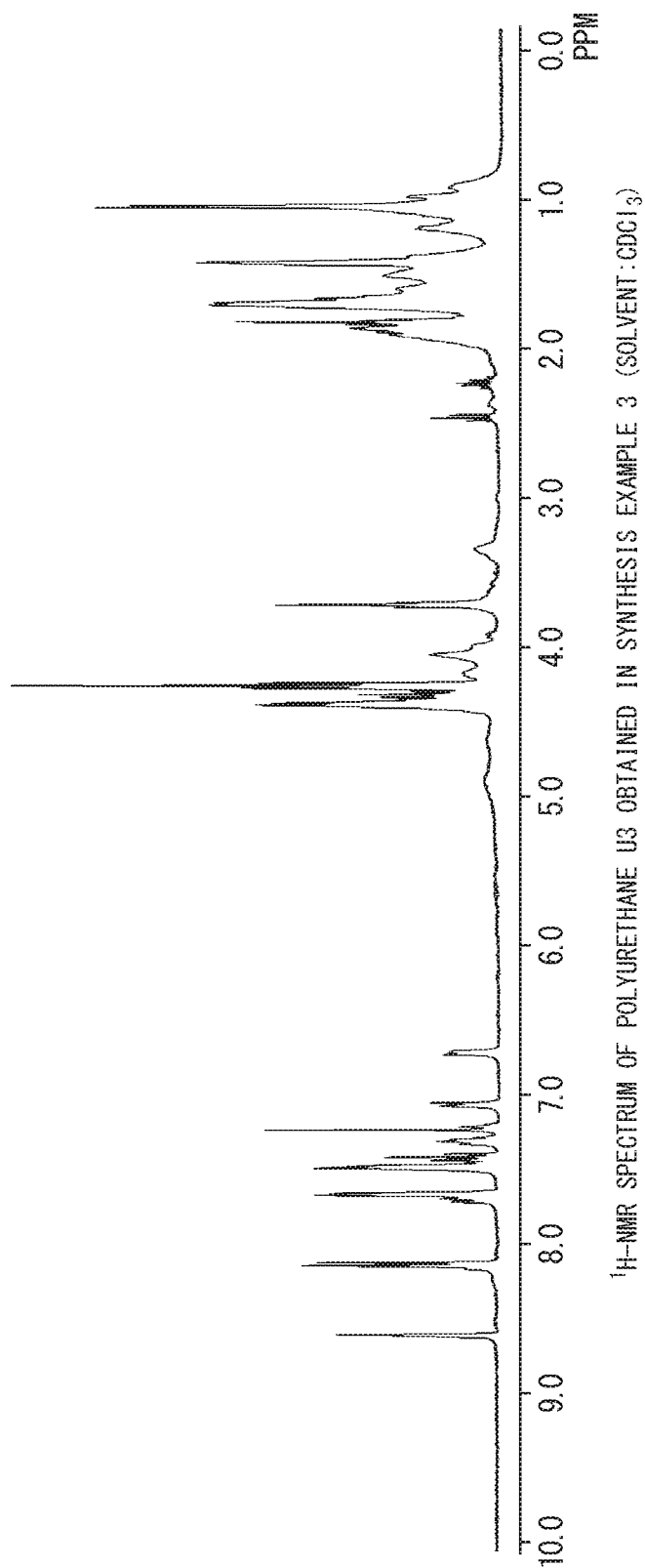

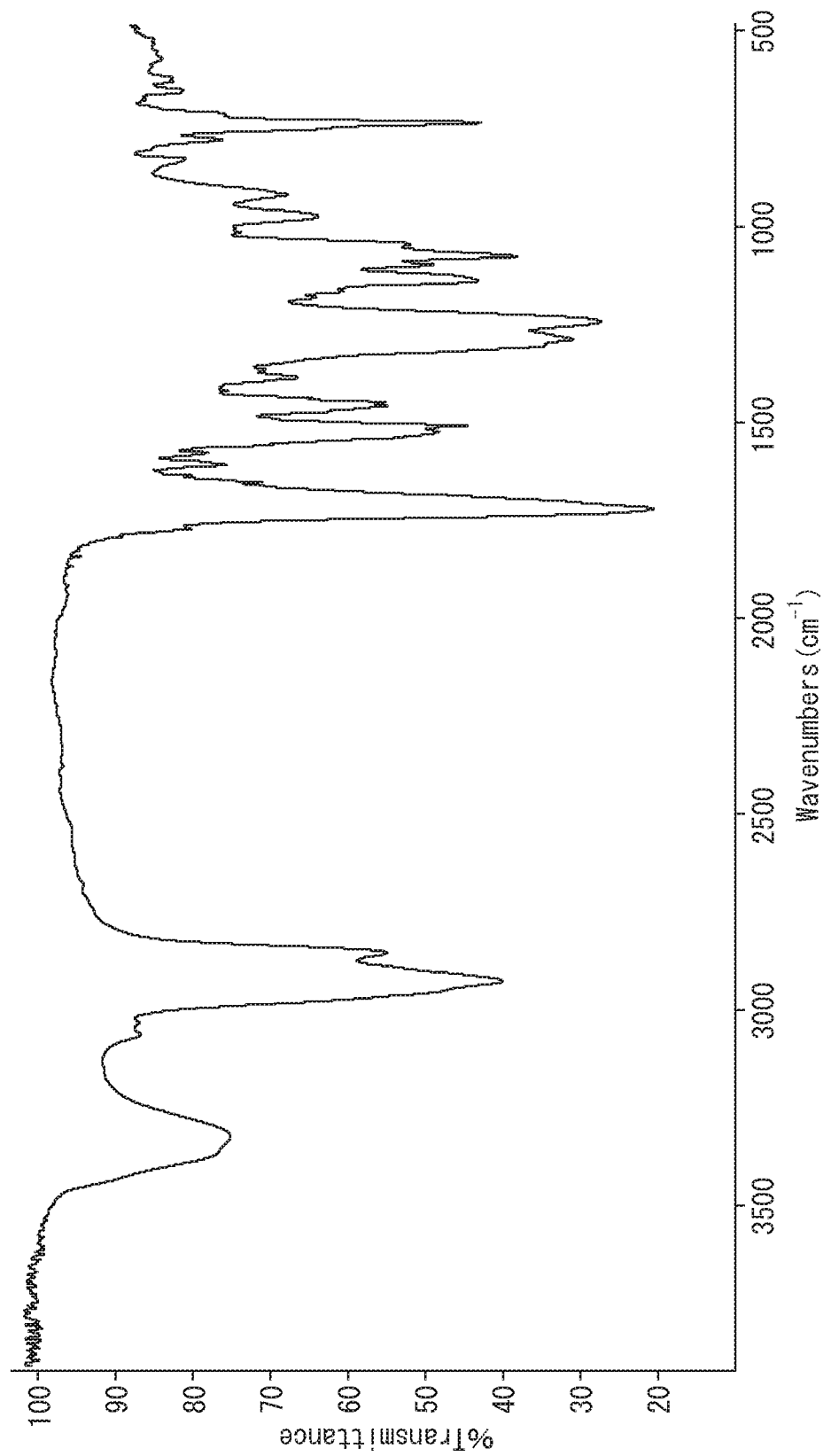

POLYURETHANE, CURABLE COMPOSITION, OVERCOAT FILM, AND FLEXIBLE WIRING BOARD AND PRODUCTION METHOD THEREFOR

CROSS REFERENCE TO RELATED APPLICATIONS

This application is a National Stage of International Application No. PCT/JP2016/087103 filed Dec. 13, 2016, claiming priority based on Japanese Patent Application No. 2015-254983 filed Dec. 25, 2015.

FIELD

The present invention relates to a novel polyurethane, a curable composition containing the polyurethane, a cured product of the curable composition, a flexible wiring board overcoat film including the cured product, a flexible wiring board covered with the overcoat film, and a method of producing a flexible wiring board covered with an overcoat film.

BACKGROUND

Polyurethanes having a fluorene structure are known (e.g., Japanese Unexamined Patent Publication (Kokai) Nos. H11-209454, H11-255859, H11-279252, and H8-003260).

However, none of these Patent Literatures offer any description with regard to a polyurethane having a carboxyl group derived from 2,2-dimethylolbutanoic acid or 2,2-dimethylolpropionic acid, or a polyurethane having a structure derived from a phenylenedicarboxylic acid.

Further, Japanese Unexamined Patent Publication (Kokai) No. 2008-101160 discloses a polyurethane which contains a structural unit having a fluorene structure and a carboxyl group derived from 2,2-dimethylolbutanoic acid or 2,2-dimethylolpropionic acid. Nevertheless, a polyurethane having a structure derived from a phenylenedicarboxylic acid is not described therein.

On the other hand, Japanese Unexamined Patent Publication Nos. H9-510250, 2008-506830 and 2014-196411 disclose polyurethanes having a structure derived from a phenylenedicarboxylic acid and a carboxyl group derived from 2,2-dimethylolbutanoic acid or 2,2-dimethylolpropionic acid. However, a polyurethane having a fluorene structure is not described therein.

Meanwhile, turning our attention to surface protective films of flexible wiring circuits, there are films of a type that is obtained by punching out a polyimide film called "coverlay film" using a mold conforming to a pattern and subsequently pasting the film with an adhesive, and films of a type that is obtained by applying a flexible UV-curable or heat-curable overcoat agent by a screen printing method. Particularly, those films of the latter type are useful in terms of workability. As such curable-type overcoat agents, resin compositions based on an epoxy resin, an acrylic resin, or a composite of these resins are known. These resin compositions often contain, as a main component, a resin modified by introduction or the like of particularly, for example, a butadiene skeleton, a siloxane skeleton, a polycarbonate diol skeleton or a long-chain aliphatic skeleton, and such modification allows to improve the flexibility and suppress the occurrence of warping due to cure shrinkage while minimizing a reduction in the heat resistance, chemical resistance and electrical insulation that are inherent to surface protective films.

However, in recent years, in association with reduction in size and weight of electronic equipment, flexible substrates have also been reduced in weight and thickness, consequently making the effects of flexibility and cure shrinkage of an overcoated resin composition more prominent and apparent. Accordingly, the existing curable-type covercoat agents no longer satisfy required performance in terms of flexibility and warping caused by cure shrinkage.

For example, Japanese Unexamined Patent Publication (Kokai) No. 2004-182792 discloses a polyamide-imide resin containing an organosiloxane skeleton; however, not only a cured product of this resin does not exhibit good adhesion with substrates but also it requires the use of a special solvent such as N-methyl-2-pyrrolidone and, particularly, such a solvent may dissolve an emulsifier during screen printing, causing problems in some cases.

Further, Japanese Unexamined Patent Publication (Kokai) No. 2006-348278 discloses a composition which contains: a carboxyl group-containing polyurethane having a polyol unit selected from the group consisting of polybutadiene polyols, polyisoprene polyols, hydrogenated polybutadiene polyols and hydrogenated polyisoprene polyols; and an epoxy compound. For instance, turning our attention to circuit pattern formation methods employed in the COF (Chip-on-Film) package systems, a subtractive method is currently employed for producing those wirings that are widely and commonly used in the COF package systems. As an insulating coating film for a wiring produced by a subtractive method, a cured product obtained from the composition disclosed in Japanese Unexamined Patent Publication (Kokai) No. 2006-348278 exhibits sufficient insulation performance.

Moreover, WO 2007/105713 A1 discloses a heat-curable composition exhibiting good adhesion to tin-plated copper substrates. With regard to cured products obtained by curing this composition, the cured product (flexible circuit board overcoat film) disclosed in WO 2007/105713 A1 exhibits sufficient insulation performance as an insulating coating film for a wiring produced by a subtractive method.

However, as semi-additive methods are more developed, the wiring pitches of flexible wiring boards are expected to be further reduced (e.g., 20 μm or less).

In association with such further pitch reduction, it is desired to develop a resin which has superior electrical insulation reliability and exhibits low warpage and flexibility that are favorable for flexible wiring boards.

In addition, since there is a problem that a reduction in the wiring pitch of a flexible wiring board sometimes results in wiring breakage when a pre-assembly module on which the flexible wiring board is mounted is moved, it is demanded to develop an overcoat film capable of inhibiting such wiring breakage.

Furthermore, Japanese Unexamined Patent Publication (Kokai) No. 2014-189746 discloses: an urethane resin composition characterized by containing a urethane resin obtained by allowing a polyisocyanate to react with a polyol that contains a specific polyol and at least one polyol selected from the group consisting of aromatic polyester polyols and polyether polyols obtained by addition of an alkylene oxide to bisphenol (Claim 1); and a polyurethane produced by allowing a polyester polyol obtained by a reaction of ethylene glycol, neopentyl glycol terephthalic acid and isophthalic acid to react with 9,9-bis(4-(2-hydroxyethoxy)phenyl)fluorene, 2,2-dimethylolpropionic acid and tolylene diisocyanate (Synthesis Example 3). However, a case where o-phthalic acid is used in place of terephthalic acid or isophthalic acid is not described therein.

CITATION LIST

Patent Literature

[Patent Literature 1] Japanese Unexamined Patent Publication (Kokai) No. H11-209454
[Patent Literature 2] Japanese Unexamined Patent Publication (Kokai) No. H11-255859
[Patent Literature 3] Japanese Unexamined Patent Publication (Kokai) No. H11-279252
[Patent Literature 4] Japanese Unexamined Patent Publication (Kokai) No. H8-003260
[Patent Literature 5] Japanese Unexamined Patent Publication (Kokai) No. 2008-101160
[Patent Literature 6] Japanese Unexamined Patent Publication (Kohyo) No. H9-510250
[Patent Literature 7] Japanese Unexamined Patent Publication (Kohyo) No. 2008-506830
[Patent Literature 8] Japanese Unexamined Patent Publication (Kokai) No. 2014-196411
[Patent Literature 9] Japanese Unexamined Patent Publication (Kokai) No. 2004-182792
[Patent Literature 10] Japanese Unexamined Patent Publication (Kokai) No. 2006-348278
[Patent Literature 11] International Publication No. WO 2007/105713 A1
[Patent Literature 12] Japanese Unexamined Patent Publication (Kokai) No. 2014-189746

SUMMARY

Technical Problem

The present invention was made in view of the above-described problems of prior art, and an object of the present invention is to develop a curable composition for providing an overcoat film which exhibits excellent low warpage, flexibility and long-term insulation reliability and exerts a prominent effect of inhibiting wiring breakage when a flexible wiring board covered with the overcoat film is shaken.

Another object of the present invention is to provide a novel polyurethane suitable as a component of the above-described curable composition.

Yet another object of the present invention is to provide an overcoat film obtained by curing the above-described curable composition, a flexible wiring board covered with the overcoat film, and a method of producing the flexible wiring board covered with the overcoat film.

Solution to Problem

The present inventors intensively studied to solve the above-described problems and consequently discovered that, when a curable composition containing a novel polyurethane having a specific structure as an indispensable component is printed on a flexible wiring board, curing of the thus printed curable composition causes only small warpage of the flexible wiring board, and an overcoat film obtained by curing this curable composition not only has excellent flexibility and long-term electrical insulation properties but also exerts a prominent wiring breakage-inhibiting effect when a flexible wiring board covered with the overcoat film is shaken, thereby completing the present invention.

In other words, the present invention includes the following embodiments.

[1] A polyurethane having
a structural unit of formula (1)

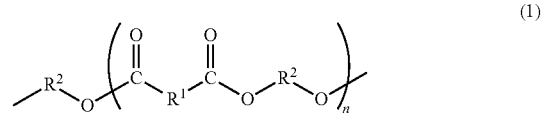

wherein n $R^1$s each independently represent a 1,2-phenylene group or a 1,2-phenylene group having a substituent; (n+1) $R^2$s each independently represent a divalent hydrocarbon group having 3 to 9 carbon atoms; and n represents an integer of 1 to 50;

a structural unit of formula (2)

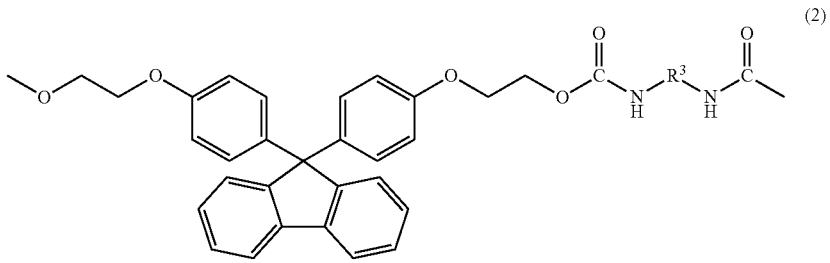

wherein $R^3$ represents a divalent organic group having 6 to 14 carbon atoms; and
a structural unit of formula (3)

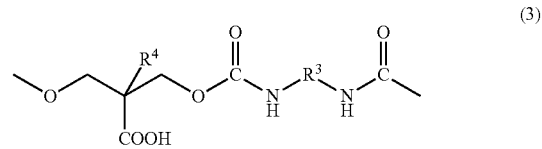

wherein $R^3$ represents a divalent group having 6 to 14 carbon atoms; and $R^4$ represents a methyl group or an ethyl group.

[2] A polyurethane having a number-average molecular weight of 10,000 to 50,000, which is composed of
a structural unit of formula (4)

(component (a)) a polyurethane having
a structural unit of formula (1')

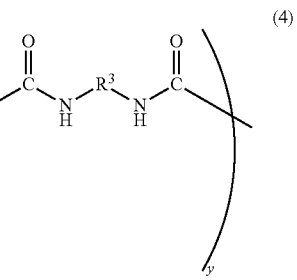

wherein n $R^1$'s each independently represent a phenylene group or a phenylene group having a substituent; (n+1) $R^2$s each independently represent a divalent hydrocarbon group having 3 to 9 carbon atoms; and n represents an integer of 1 to 50;

a structural unit of formula (2)

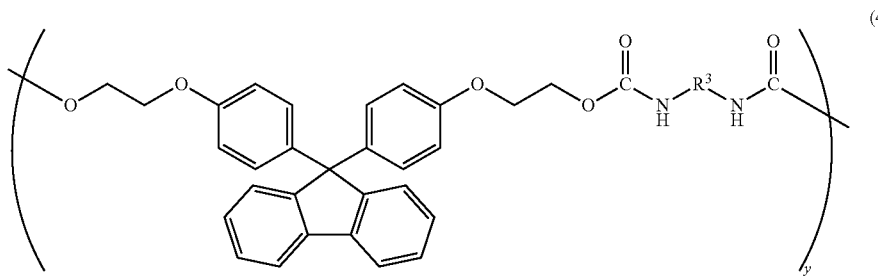

wherein $R^3$ represents a divalent organic group having 6 to 14 carbon atoms; and
a structural unit of formula (3)

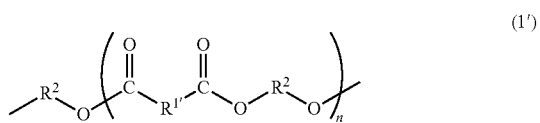

wherein $R^3$ represents a divalent organic group having 6 to 14 carbon atoms; and $R^4$ represents a methyl group or an ethyl group;

(component (b)) a solvent; and
(component (c)) a compound having two or more epoxy groups in one molecule.

[6] The curable composition according to [5], wherein the amount of component (b) is 25 to 75% by mass based on the total amount of components (a), (b) and (c), and wherein y $R^3$s each independently represent a divalent organic group having 6 to 14 carbon atoms; and y represents an integer of not less than one:

a structural unit of formula (5)

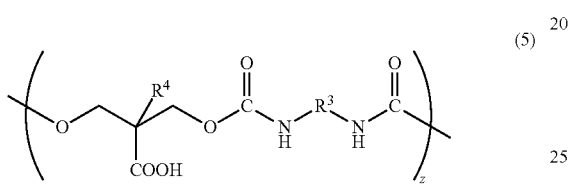

wherein z $R^3$s each independently represent a divalent organic group having 6 to 14 carbon atoms; z $R^4$s each independently represent a methyl group or an ethyl group; and z represents an integer of not less than one; and a structural unit of formula (6)

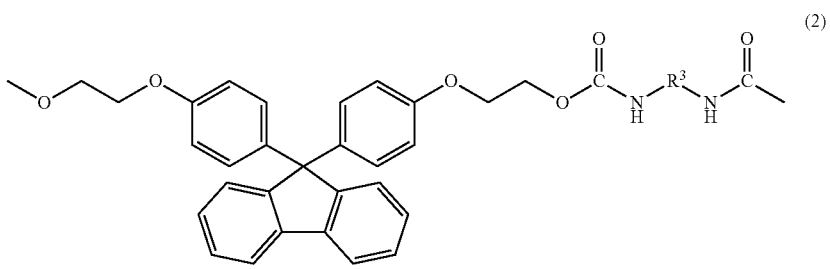

wherein, (l×m) $R^1$'s each independently represent a phenylene group or a phenylene group having a substituent; [(l+1)×m] $R^2$s each independently represent a hydrocarbon group having 3 to 9 carbon atoms; m $R^3$s each independently represent a divalent organic group having 6 to 14 carbon atoms; m represents an integer of not less than one; and l independently represents an integer of 0 to 50, excluding a case where all of the m ls are 0.

[3] The polyurethane according to [1] or [2], having an acid value of 10 to 70 mg-KOH/g.

[4] The polyurethane according to any one of [1] to [3], having an aromatic ring concentration of 0.1 to 5.0 mmol/g.

[5] A curable composition comprising the amount of component (a) is 40 to 99% by mass and the amount of component (c) is 1 to 60% by mass, based on the total amount of components (a) and (c).

[7] The curable composition according to [5], further comprising (component (d)) at least one particulate selected from the group consisting of an inorganic particulate and organic particulate.

[8] The curable composition according to [7], wherein component (d) comprises a silica particulate.

[9] The curable composition according to [7], wherein component (d) comprises a hydrotalcite particulate.

[10] The curable composition according to any one of [7] to [9], wherein the amount of component (b) is 25 to 75% by mass and the amount of component (d) is 0.1 to 60% by mass, based on the total amount of components (a), (b), (c) and (d), and the amount of component (a) is 40 to 99% by mass and the amount of component (c) is 1 to 60% by mass, based on the total amount of components (a) and (c).

[11] A cured product of the curable composition according to any one of 151 to [10].

[12] A flexible wiring board overcoat film comprising the cured product according to [11].

[13] A flexible wiring board comprising a flexible substrate and a wiring formed on the flexible substrate, wherein a part or all of a surface on which the wiring is formed is covered with the overcoat film according to [12].

[14] The flexible wiring board according to [13], wherein the wiring is a tin-plated copper wiring.

[15] A method of producing a flexible wiring board covered with an overcoat film, comprising (step 1) the step of printing the curable composition according to any one of [5] to [10] on at least a part of a wiring pattern section of a flexible wiring board to form a printed film on the pattern;

(step 2) the step of placing the printed film obtained in step 1 in an atmosphere of 40 to 100° C. to evaporate a part or all of the solvent contained in the printed film; and (step 3) the step of heating and curing the printed film obtained in step 1 or the printed film obtained in step 2 at 100 to 170° C. to form an overcoat film.

Advantageous Effects of Invention

Curing of the curable composition of the present invention yields an overcoat film that exhibits excellent low warpage, flexibility and long-term insulation reliability, and an overcoat film that exerts a prominent wiring breakage-inhibiting effect when a flexible wiring board covered with the overcoat film is shaken can thereby be provided.

BRIEF DESCRIPTION OF DRAWINGS

FIG. 2 illustrates the IR spectrum of polyurethane U1 obtained in Synthesis Example 1.

FIG. 3 illustrates the $^1$H-NMR spectrum (solvent: CDCl$_3$) of polyurethane U2 obtained in Synthesis Example 2.

FIG. 4 illustrates the IR spectrum of polyurethane U2 obtained in Synthesis Example 2.

FIG. 5 illustrates the $^1$H-NMR spectrum (solvent: CDCl$_3$) of polyurethane U3 obtained in Synthesis Example 3.

FIG. 6 illustrates the IR spectrum of polyurethane U3 obtained in Synthesis Example 3.

DESCRIPTION OF EMBODIMENTS

Figure 1:
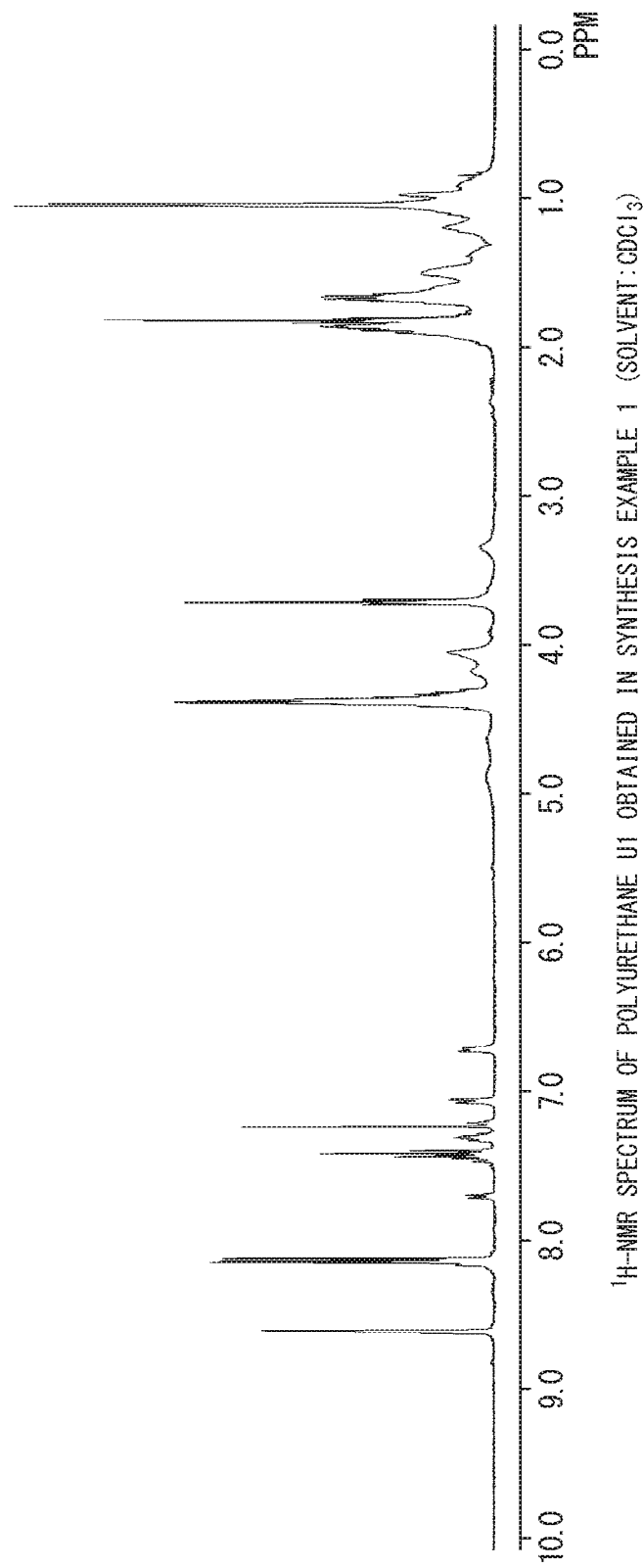
FIG. 1 illustrates the $^1$H-NMR spectrum (solvent: CDCl$_3$) of polyurethane U1 obtained in Synthesis Example 1.

The present invention is described below in detail.

First, the polyurethane of the present invention will be described.

The polyurethane of the present invention is a polyurethane having a structural unit of following formula (1), a structural unit of following formula (2), and a structural unit of following formula (3):

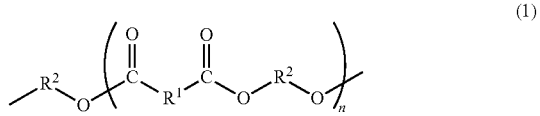

(1)

wherein n R$^1$s each independently represent a 1,2-phenylene group or a 1,2-phenylene group having a substituent; (n+1) R$^2$s each independently represent a divalent hydrocarbon group having 3 to 9 carbon atoms; and n represents an integer of 1 to 50.

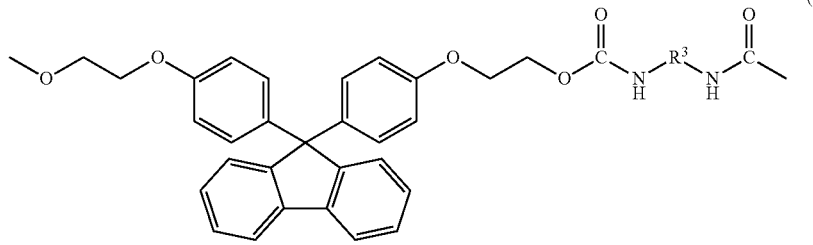

(2)

wherein R$^3$ represents a divalent organic group having 6 to 14 carbon atoms.

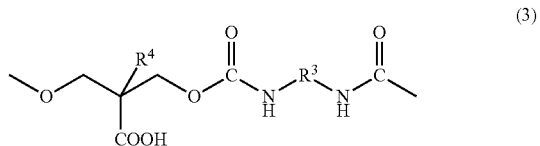

(3)

wherein R$^3$ represents a divalent organic group having 6 to 14 carbon atoms; and R$^4$ represents a methyl group or an ethyl group.

In formula (1), n R$^1$'s each independently represent a 1,2-phenylene group or a 1,2-phenylene group having a substituent. Examples of the substituent include alkyl groups having 1 to 5 carbon atoms, halogen atoms, etc. Specific examples of R$^1$ include a 1,2-phenylene group, a 3-methyl-1,2-phenylene group, a 4-methyl-1,2-phenylene group, a 3-chloro-1,2-phenylene group, a 4-chloro-1,2-phenylene group, a 3-bromo-1,2-phenylene group, a 4-bromo-1,2-phenylene group, and the like, and n $R^1$s may all be the same, or some or all thereof may be different.

Thereamong, at least one of n $R^1$s is preferably a group selected from the group consisting of a 1,2-phenylene group, a 3-methyl-1,2-phenylene group and a 4-methyl-1,2-phenylene group, and it is more preferable that at least one of n $R^1$s be a 1,2-phenylene group.

In formula (1), (n+1) $R^2$s each independently represent a divalent hydrocarbon group having 3 to 9 carbon atoms. The divalent hydrocarbon group having 3 to 9 carbon atoms is preferably an alkylene group or a cycloalkylene group and, between these groups, an alkylene group is more preferable. Examples thereof include groups represented by following formulae (7) to (17), and (n+1) $R^2$s may all be the same, or some or all thereof may be different. It is preferable that n be 1 to 20.

  (7)

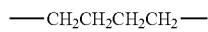  (8)

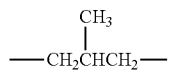  (9)

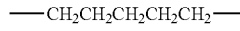  (10)

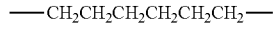  (11)

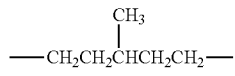  (12)

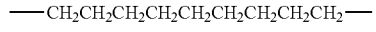  (13)

  (14)

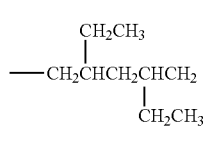  (15)

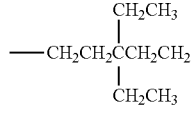  (16)

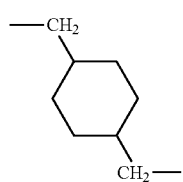  (17)

Thereamong, at least one of (n+1) $R^2$s is preferably a group represented by any one of formulae (10) to (12), more preferably a group represented by formula (11) or (12), and it is most preferable that (n+1) $R^2$s be groups represented by formula (11) or (12).

In formula (1), n represents an integer of 1 to 50. It is preferable that n be 1 to 20.

In formulae (2) and (3), $R^3$ represents a divalent organic group having 6 to 14 carbon atoms. Examples of the divalent organic group having 6 to 14 carbon atoms include chain aliphatic divalent organic groups, aromatic ring-containing divalent organic groups, divalent organic groups having an alicyclic structure, and the like. Examples of the chain aliphatic divalent organic groups include groups represented by following formulae (18) to (21). Examples of the aromatic ring-containing divalent organic groups include groups represented by following formulae (22) to (25). Examples of the divalent organic groups having an alicyclic structure include groups represented by following formulae (26) to (30). Plural $R^3$s may all be the same, or some or all thereof may be different.

  (18)

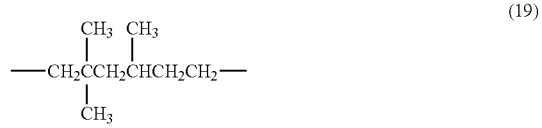  (19)

  (20)

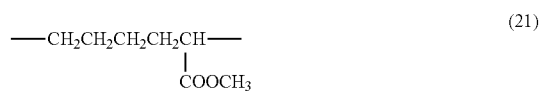  (21)

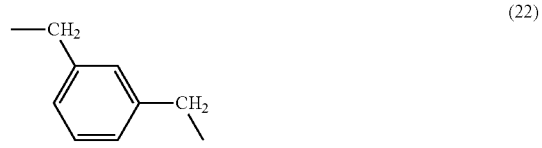  (22)

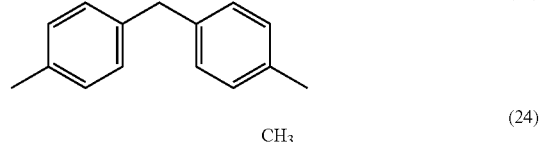  (23)

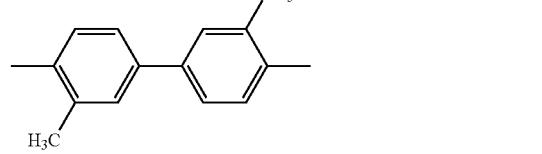  (24)

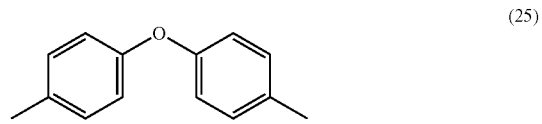  (25)

  (26)

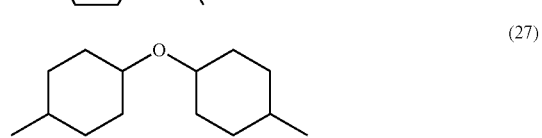  (27)

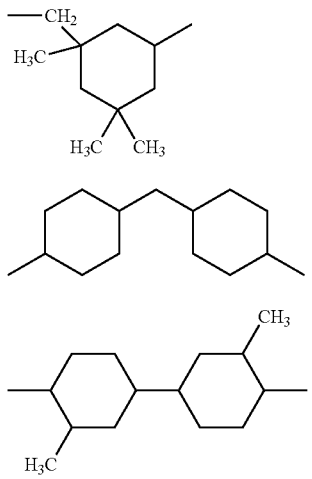

(28)

(29)

(30)

Taking into consideration the long-term insulation reliability of the below-described flexible wiring board overcoat film, at least one of plural $R^3$s is preferably a divalent organic group having an alicyclic structure. It is more preferable that all of plural $R^3$s be divalent organic groups having an alicyclic structure, and it is particularly preferable that all of plural $R^3$s be at least one group selected from the group consisting of formulae (28) and (29).

In formula (3), $R^4$ represents a methyl group or an ethyl group.

A method of synthesizing the polyurethane of the present invention is not particularly limited, and the polyurethane of the present invention can be produced by, for example, the following method.

As a method of synthesizing the polyurethane of the present invention, for example, the polyurethane of the present invention can be synthesized by allowing a compound of following formula (31), a compound of following formula (32), a diisocyanate compound in which an isocyanato group is bound to a divalent organic group having 6 to 14 carbon atoms, a compound of following formula (33) and, as required, a polyol other than the compounds of formulae (31), (32) and (33), a monohydroxyl compound, and a monoisocyanate compound to react with each other using a solvent in the presence or absence of a known urethanization catalyst such as dibutyl tin dilaurate. This reaction is preferably performed in the absence of a catalyst, or in the presence of only a small amount of a catalyst even when it is used, since the physical property values of the below-described overcoat film of the present invention in actual use for insulation are thereby ultimately improved.

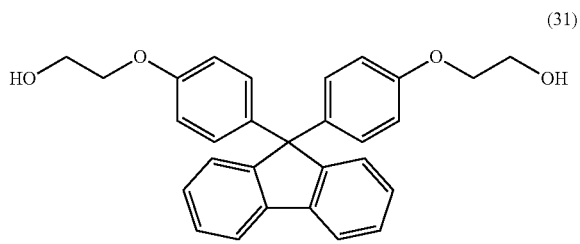

(31)

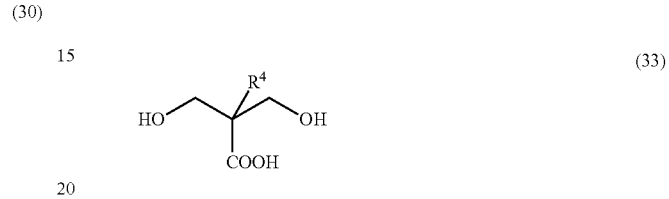

(32)

wherein n $R^1$s each independently represent a 1,2-phenylene group or a 1,2-phenylene group having a substituent; (n+1) $R^2$s each independently represent a divalent hydrocarbon group having 3 to 9 carbon atoms; and n represents an integer of 1 to 50.

$$HO\diagup\overset{R^4}{\underset{COOH}{|}}\diagdown OH$$

(33)

wherein $R^4$ represents a methyl group or an ethyl group.

Specific examples of the diisocyanate compound in which an isocyanato group is bound to a divalent organic group having 6 to 14 carbon atoms include isophorone diisocyanate, methylenebis(4-cyclohexylisocyanate), 1,3-bis(isocyanatomethyl)cyclohexane, 1,4-bis(isocyanatomethyl)cyclohexane, diphenylmethane-4,4'-diisocyanate, 1,3-xylylene diisocyanate, 1,4-xylylene diisocyanate, biuret of isophorone diisocyanate, biuret of hexamethylene diisocyanate, 2,4,4-trimethylhexamethylene diisocyanate, 2,2,4-trimethylhexamethylene diisocyanate, norbornane diisocyanate, and the like.

In order to maintain high electrical insulation performance of the below-described overcoat film of the present invention, isophorone diisocyanate, methylenebis(4-cyclohexylisocyanate), 1,3-bis(isocyanatomethyl)cyclohexane, 1,4-bis(isocyanatomethyl)cyclohexane, diphenylmethane-4,4'-diisocyanate, 1,3-xylylene diisocyanate, 1,4-xylylene diisocyanate, 2,4,4-trimethylhexamethylene diisocyanate, 2,2,4-trimethylhexamethylene diisocyanate and norbornane diisocyanate are preferable, and methylenebis(4-cyclohexylisocyanate) and isophorone diisocyanate are more preferable.

These diisocyanate compounds may be used singly, or in combination of two or more thereof.

Examples of the compound of formula (32) include polyester polyols constituted by a combination of at least one selected from the group consisting of the below-described dicarboxylic acids and at least one selected from the group consisting of the below-described diols.

Examples of dicarboxylic acids include o-phthalic acid, 3-methyl-benzene-1,2-dicarboxylic acid, 4-methyl-benzene-1,2-dicarboxylic acid, and the like.

Further, examples of diols include 1,3-propanediol, 1,2-propanediol, 1,4-butanediol, 1,5-pentanediol, 1,6-hexanediol, 3-methyl-1,5-pentanediol, 1,8-octanediol, 1,9-nonanediol, 2,4-diethyl-1,5-pentanediol, 2-ethyl-2-butyl-1,3-propanediol, and the like.

From the standpoint of simultaneously suppressing the crystallinity and the hydrolytic property of ester bonds as much as possible so as to allow low warpage and good electrical insulation reliability to be exhibited, the dicarboxylic acids are preferably o-phthalic acid, 3-methyl-benzene-1,2-dicarboxylic acid, and 4-methyl-benzene-1,2-dicarboxylic acid, particularly preferably o-phthalic acid.

Preferable examples of the diols include 1,3-propanediol, 1,4-butanediol, 1,5-pentanediol, 1,6-hexanediol, and 3-methyl-1,5-pentanediol. Particularly preferable diols are 1,6-hexanediol and 3-methyl-1,5-pentanediol, and the most preferable diol is 1,6-hexanediol.

As the compound of formula (32), it is preferable to use one having a number-average molecular weight of 800 to 5,000, more preferably 800 to 3,000, particularly preferably 900 to 2,500.

As the compound represented by formula (32), a polyester polyol may be used singly, or two or more thereof may be used in combination.

Examples of the compound of formula (33) include 2,2-dimethylolpropionic acid and 2,2-dimethylolbutanoic acid.

When a low-molecular-weight polyol is used as the polyol other than the compounds of formulae (31), (32) and (33), for example, 1,2-propanediol, 1,3-butanediol, 1,4-butanediol, 3-methyl-1,5-pentanediol, 1,6-hexanediol, 1,4-cyclohexanedimethanol, neopentyl glycol, diethylene glycol, dipropylene glycol, glycerin, trimethylolpropane, and the like can be used singly or in combination of two or more thereof, and it is preferable to use 1,6-hexanediol or 3-methyl-1,5-pentanediol.

The molecular weight of the polyurethane of the present invention is not particularly limited; however, taking into consideration the ease of adjusting the viscosity of the below-described curable composition of the present invention, the number-average molecular weight of the polyurethane of the present invention is preferably 10,000 to 50,000, more preferably 10,000 to 40,000, still more preferably 10,000 to 30,000. When the number-average molecular weight is 10,000 to 50,000, the elasticity, flexibility and strength of the resulting cured film are not impaired, and the polyurethane exhibits good solubility in solvents and does not yield an excessively viscous solution when dissolved; therefore, the polyurethane can be suitably used in the below-described curable composition of the present invention.

The term "number-average molecular weight" used herein refers to a number-average molecular weight in terms of polystyrene that is measured by gel permeation chromatography (hereinafter referred to as "GPC").

In the present specification, unless otherwise specified, the GPC measurement conditions are as follows.

Apparatus: HPLC unit HSS-2000, manufactured by JASCO Corporation

Columns: SHODEX column LF-804 (three columns connected in series)

Mobile phase: tetrahydrofuran

Flow rate: 1.0 mL/min

Detector: RI-2031 Plus, manufactured by JASCO Corporation

Temperature: 40.0° C.

Sample amount: Sample Loop 100 μL

Sample concentration: adjusted to be about 0.1% by mass

The acid value of the polyurethane of the present invention is preferably 10 to 70 mg-KOH/g, more preferably 10 to 50 mg-KOH/g, particularly preferably 15 to 35 mg-KOH/g. When the acid value of the polyurethane of the present invention is 10 to 70 mg-KOH/g, a good balance can be easily attained between the solvent resistance of the below-described overcoat film of the present invention and the warpage of the below-described flexible wiring board of the present invention.

It is noted here that, in the present specification, the acid value of a polyurethane A is an acid value measured by a potentiometric titration method in accordance with JIS K0070.

The aromatic ring (mainly derived from $R^1$) content (hereinafter also referred to as "aromatic ring concentration") of the polyurethane of the present invention is preferably 0.1 to 5.0 mmol based on 1 g of the polyurethane of the present invention (i.e., 0.1 to 5.0 mmol/g), more preferably 0.5 to 4.5 mmol based on 1 g of the polyurethane of the present invention (i.e., 0.5 to 4.5 mmol/g), particularly preferably 1.0 to 4.0 mmol based on 1 g of the polyurethane of the present invention (i.e., 1.0 to 4.0 mmol/g). When the aromatic ring content of the polyurethane of the present invention is 0.1 to 0.5 mmol based on 1 g of the polyurethane of the present invention (i.e., 0.1 to 0.5 mmol/g), a good balance can be easily attained between the solvent resistance of the below-described overcoat film of the present invention and the warpage of the below-described flexible wiring board of the present invention.

The aromatic ring concentration can be calculated from the material addition ratio; however, it can also be analyzed by determining the structure based on $^1$H-NMR $^{13}$C-NMR and IR spectra and then comparing the number of protons derived from an aromatic ring and the number of protons derived from a unit in the $^1$H-NMR spectrum (comparison based on a 1H-NMR integral curve).

As for the number of aromatic rings in the present specification, an aromatic ring is counted as 1, and a condensed ring is also counted as 1. For example, a benzene ring of following formula (51) is counted as one aromatic ring. A biphenyl structure of following formula (52) and a 9H-fluorene structure of following formula (53) each have two benzene rings and are thus counted as two aromatic rings. A naphthalene structure of following formula (54) is also counted as two aromatic rings. In the same manner, an anthracene structure (formula (55)) and a phenanthrene structure (formula (56)) are each counted as three aromatic rings. A triphenylene structure (formula (77)) and a binaphthyl structure (formula (58)) are each counted as four aromatic rings.

It is noted here that the number of circles (o) in following formulae (51') to (58') each represent the number of aromatic rings in respective formulae (51) to (58).

(51)

(52)

(53)

(54)

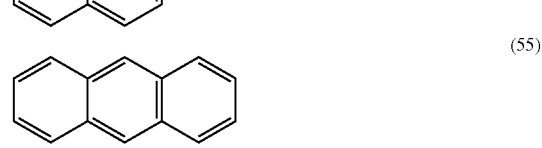

(55)

-continued

(56) 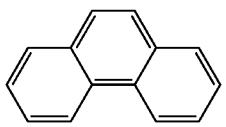

(57) 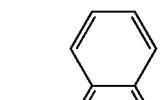

(58) 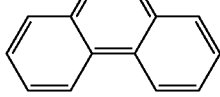

(51') 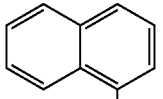

(52') 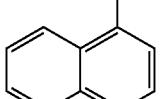

(53') 

(54') 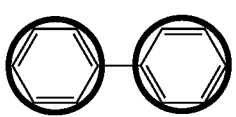

(55') 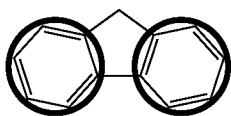

(56') 

(57') 

(58') 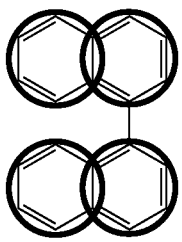

The solvent used in the production of the polyurethane of the present invention is not particularly limited as long as it is capable of dissolving the polyurethane of the present invention, and examples thereof include ether-based solvents, such as diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, and tripropylene glycol dimethyl ether; ester-based solvents, such as ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, and γ-butyrolactone; hydrocarbon-based solvents, such as decahydronaphthalene; and ketone-based solvents, such as cyclohexanone. These solvents may be used singly, or in combination of two or more thereof.

Thereamong, taking into consideration the ease of adjusting the molecular weight and the screen printing properties of the below-described curable composition, γ-butyrolactone, diethylene glycol diethyl ether, diethylene glycol monoethyl ether acetate and diethylene glycol monomethyl ether acetate are preferable; γ-butyrolactone, diethylene glycol monoethyl ether acetate and diethylene glycol diethyl ether are more preferable; and a single-component solvent of γ-butyrolactone, a two-component mixed solvent of γ-butyrolactone and diethylene glycol monoethyl ether acetate, a two-component mixed solvent of γ-butyrolactone and diethylene glycol diethyl ether, and a three-component mixed solvent of γ-butyrolactone, diethylene glycol monoethyl ether acetate and diethylene glycol diethyl ether are most preferable.

The post-production solid concentration of the polyurethane of the present invention is preferably 10 to 90% by mass, more preferably 15 to 70% by mass, particularly preferably 20 to 60% by mass. When a solution having a solid concentration of 20 to 60% by mass is used to directly produce the below-described curable composition of the present invention, from the standpoint of attaining uniform dispersion, the solution viscosity of the polyurethane of the present invention is preferably, for example, 5,000 to 1,000,000 mPa·s under the measurement conditions described in Examples.

The order of adding raw materials in the production of the polyurethane of the present invention is not particularly limited; however, the compounds of formulae (31), (32) and (33) and, as required, a polyol other than the compounds of formulae (31), (32) and (33) are dissolved in a solvent, and a diisocyanate compound in which an isocyanato group is bound to a divalent organic group having 6 to 14 carbon atoms is subsequently added dropwise thereto at 30 to 140° C., more preferably 60 to 120° C., after which these materials are allowed to react with each other at 50 to 160° C., more preferably 60° C. to 150° C.

The molar ratio of the raw materials to be added is adjusted in accordance with the molecular weight and the acid value of the desired polyurethane (i.e., the polyurethane of the present invention). For the adjustment of the molecular weight of the polyurethane, a monohydroxyl compound may be used as a raw material of the polyurethane of the present invention. In such a case, the monohydroxyl compound is added when the carboxyl group-containing polyurethane which is being produced by the above-described method has attained (or has come close to attaining) the desired number-average molecular weight, for the purposes of capping terminal isocyanato groups of the carboxyl group-containing polyurethane which is being produced and inhibiting a further increase in the number-average molecular weight.

When a monohydroxyl compound is used, there is no problem at all regardless of whether the total number of isocyanato groups contained in all of the raw material components of the polyurethane of the present invention is less than, equal to, or greater than the total number of hydroxyl groups that is determined by subtracting the number of hydroxyl groups of the monohydroxyl compound from the number of alcoholic hydroxyl groups contained in all of the raw material components of the polyurethane of the present invention (i.e., the total number of alcoholic hydroxyl groups of a compound having two or more alcoholic hydroxyl groups that is used as a raw material of the polyurethane of the present invention).

When a monohydroxyl compound is used in excess, unreacted monohydroxyl compound will remain as a result. In such a case, the excess monohydroxyl compound may be directly used as a part of the solvent, or may be removed by distillation or the like.

A monohydroxyl compound is used as a raw material of the polyurethane for the purpose of suppressing an increase in the molecular weight of the resulting polyurethane of the present invention (i.e., quenching). The monohydroxyl compound is added dropwise to the solution at 30 to 150° C., more preferably 70 to 140° C., and the resultant is subsequently maintained at the same temperature to complete the reaction.

Further, in order to adjust the molecular weight of the resulting polyurethane, a monoisocyanate compound may also be used as a raw material of the polyurethane of the present invention. In this case, it is required that the value obtained by subtracting the number of isocyanato groups of the monoisocyanate compound from the number of isocyanato groups contained in all of the raw material components of the polyurethane of the present invention (i.e., the total number of isocyanato groups of a polyisocyanate compound used as a raw material of the polyurethane of the present invention) be smaller than the total number of alcoholic hydroxyl groups contained in all of the raw material components of the polyurethane of the present invention such that the terminals of the polyurethane which is being produced prior to the use of the monoisocyanate compound in the reaction are converted to hydroxyl groups. Once the reaction between the alcoholic hydroxyl groups contained in all of the raw material components of the polyurethane of the present invention and the isocyanato groups of the polyisocyanate compound used in the polyurethane of the present invention is substantially completed, the monoisocyanate compound is added dropwise to a solution of the carboxyl group-containing polyurethane being produced at 30 to 150° C., more preferably 70 to 140° C., so as to allow the hydroxyl groups remaining at the terminals of the polyurethane which is being produced to react with the monoisocyanate compound, and the resulting solution is subsequently maintained at the same temperature to complete the reaction.

In the method of producing the polyurethane of the present invention, the amounts of the respective components to be added are preferably as follows. The amount of the compound of formula (33) is preferably 1 to 20% by mass, more preferably 2 to 10% by mass, based on the total amount of the raw materials of the polyurethane of the present invention. The ratio between the total number of alcoholic hydroxyl groups of the compound having two or more alcoholic hydroxyl groups that is used as a raw material of the polyurethane of the present invention and the total number of isocyanato groups of the polyisocyanate compound used as a raw material of the polyurethane of the present invention is preferably 1:0.9 to 0.9:1, more preferably 1:0.92 to 0.92:1. Further, the amount of the compound of formula (31) to be used based on the mass obtained by subtracting the mass of the monohydroxy compound and the monoisocyanate compound from the total mass of the raw material components of the polyurethane of the present invention is preferably 3 to 20% by mass, more preferably 5 to 15% by mass. When the compound of formula (31) is used in a range of 3 to 20% by mass based on the mass obtained by subtracting the mass of the monohydroxy compound and the monoisocyanate compound from the total mass of the raw material components of the polyurethane of the present invention, a good balance can be attained between the effect of inhibiting wiring breakage of the below-described flexible wiring board of the present invention and the warpage of the flexible wiring board.

Next, the curable composition of the present invention will be described.

The curable composition of the present invention is a curable composition comprising at least following components (a) to (c):

(component (a)) a polyurethane having
a structural unit of formula (1')

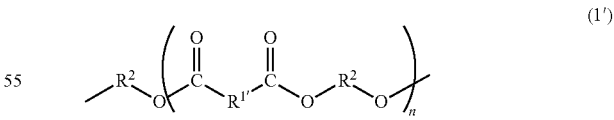

wherein n R$^1$'s each independently represent a phenylene group or a phenylene group having a substituent; (n+1) R$^2$s each independently represent a divalent hydrocarbon group having 3 to 9 carbon atoms, and n represents an integer of 1 to 50;

a structural unit of formula (2)

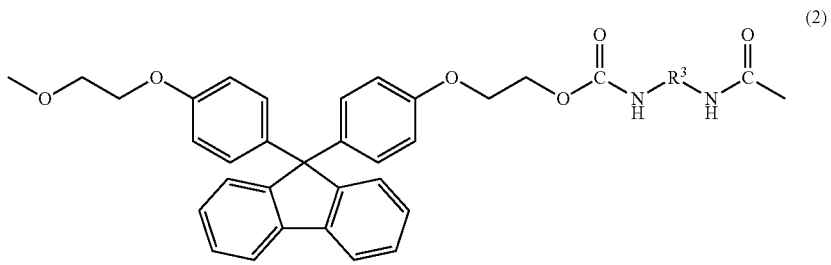

(2)

wherein $R^3$ represents a divalent organic group having 6 to 14 carbon atoms; and a structural unit of formula (3)

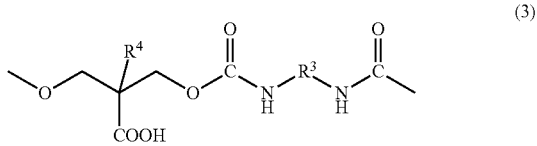

(3)

wherein $R^3$ represents a divalent organic group having 6 to 14 carbon atoms; and $R^4$ represents a methyl group or an ethyl group;

(component (b)) a solvent; and (component (c)) a compound having two or more epoxy groups in one molecule.

In formula (1'), n $R^{1'}$ each independently represent a phenylene group or a phenylene group having a substituent. Examples of the substituent include alkyl group having 1 to 5 carbon atoms, halogen atoms, etc. Specific examples of $R^1$ include a 1,2-phenylene group, a 1,3-phenylene group, a 1,4-phenylene group, a 3-methyl-1,2-phenylene group, a 4-methyl-1,2-phenylene group, a 4-methyl-1,3-phenylene group, a 2-methyl-1,4-phenylene group, a 3-chloro-1,2-phenylene group, a 4-chloro-1,2-phenylene group, a 4-chloro-1,3-phenylene group, a 2-chloro-1,4-phenylene group, a 3-bromo-1,2-phenylene group, a 4-bromo-1,2-phenylene group, a 4-bromo-1,3-phenylene group, a 2-bromo-1,4-phenylene group, and the like, and n $R^{1'}$s may all be the same, or some or all thereof may be different.

Thereamong, at least one of n $R^{1'}$s is preferably a group selected from the group consisting of a 1,2-phenylene group, a 1,3-phenylene group, a 3-methyl-1,2-phenylene group, a 4-methyl-1,2-phenylene group and a 4-methyl-1,3-phenylene group. It is more preferable that at least one of n $R^{1'}$s be a 1,2-phenylene group or a 1,3-phenylene group, and it is particularly preferable that at least one of n $R^{1'}$s be a 1,2-phenylene group.

In formula (1'), $R^2$ and n have the same meanings as those of formula (1).

The polyurethane of component (a) can be produced in the same manner as the above-described polyurethane of the present invention, except that a compound of formula (32) in which $R^1$ is replaced with $R^{1'}$ is used.

Examples of the compound of formula (32) in which $R^1$ is replaced with $R^{1'}$ include polyester polyols constituted by a combination of at least one selected from the group consisting of the below-described dicarboxylic acids and at least one selected from the group consisting of the below-described diols.

Examples of dicarboxylic acids include o-phthalic acid, isophthalic acid, terephthalic acid, 3-methyl-benzene-1,2-dicarboxylic acid, 4-methylbenzene-1,2-dicarboxylic acid, 4-methylbenzene-1,3-dicarboxylic acid, 5-methylbenzene-1,3-dicarboxylic acid, 2-methylbenzene-1,4-dicarboxylic acid, and the like.

Further, examples of diols include 1,3-propanediol, 1,2-propanediol, 1,4-butanediol, 1,5-pentanediol, 1,6-hexanediol, 3-methyl-1,5-pentanediol, 1,8-octanediol, 1,9-nonanediol, 2,4-diethyl-1,5-pentanediol, 2-Ethel-2-butyl-1,3-propanediol, and the like.

Component (b), which is an indispensable component of the curable composition of the present invention, is a solvent.

The solvent used as component (b) is not particularly limited as long as it is capable of dissolving the polyurethane of the present invention, and examples thereof include ether-based solvents, such as diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, and tripropylene glycol dimethyl ether; ester-based solvents, such as ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monomethyl ether acetate, diethylene glycol monoethyl ether acetate, methyl methoxypropionate, ethyl methoxypropionate, methyl ethoxypropionate, ethyl ethoxypropionate, and γ-butyrolactone; hydrocarbon-based solvents, such as decahydronaphthalene; and ketone-based solvents, such as cyclohexanone. These solvents may be used singly, or in combination of two or more thereof.

Thereamong, taking into consideration the balance between the screen printing properties and the solvent volatility, γ-butyrolactone, diethylene glycol diethyl ether, diethylene glycol monoethyl ether acetate and diethylene glycol monomethyl ether acetate are preferable; γ-butyrolactone, diethylene glycol monoethyl ether acetate and diethylene glycol diethyl ether are more preferable; and a single-component solvent of γ-butyrolactone, a two-component mixed solvent of γ-butyrolactone and diethylene glycol monoethyl ether acetate, a two-component mixed solvent of γ-butyrolactone and diethylene glycol diethyl ether, and a three-component mixed solvent of γ-butyrolactone, diethylene glycol monoethyl ether acetate and diethylene glycol diethyl ether are most preferable.

Any combination of these preferable solvents is excellent as a solvent of a screen printing ink and thus suitably used.

Further, as a part of these preferable solvents, it is possible and preferable from the process standpoint to directly use the solvent used for the synthesis of the polyurethane of the present invention as a part of the solvents of the curable composition of the present invention.

Component (c), which is an indispensable component of the curable composition of the present invention, is a compound having two or more epoxy groups in one molecule. Component (c) reacts with —COOH or —OH of the polyurethane of component (a) to form a cured product.

Component (c) is not particularly limited as long as it is a compound having two or more epoxy groups in one molecule. Examples thereof include novolac-type epoxy resins such as phenol novolac-type epoxy resins and o-cresol novolac-type epoxy resins, which are produced by epoxidation of a novolac resin obtained by condensation or co-condensation of a phenol (e.g., phenol, cresol, xylenol, resorcin, or catechol) and/or a naphthol (e.g., α-naphthol, β-naphthol, or dihydroxynaphthalene) with an aldehyde group-containing compound (e.g., formaldehyde, acetaldehyde, propionaldehyde, benzaldehyde, or salicylaldehyde) in the presence of an acid catalyst; diglycidyl ethers of bisphenol A, bisphenol F, bisphenol S, alkyl-substituted or unsubstituted biphenols, and stilbene-based phenols (bisphenol A-type epoxy compounds, bisphenol F-type epoxy compounds, bisphenol S-type epoxy compounds, biphenyl-type epoxy compounds, and stilbene-type epoxy compounds); glycidyl ethers of alcohols, such as butanediol, polyethylene glycol and polypropylene glycol; glycidyl ester-type epoxy resins of carboxylic acids, such as o-phthalic acid, isophthalic acid and tetrahydrophthalic acid; glycidyl-type or methylglycidyl-type epoxy resins, such as those obtained by substitution of an active hydrogen(s) bound to a nitrogen atom(s) of aniline, bis(4-aminophenyl) methane, isocyanuric acid or the like with a glycidyl group(s); glycidyl-type or methylglycidyl-type epoxy resins, such as those obtained by substitution of an active hydrogen bound to the nitrogen atom and an active hydrogen of the phenolic hydroxyl group that are contained in an aminophenol (e.g., p-aminophenol) with glycidyl groups; alicyclic epoxy resins obtained by epoxidation of an intramolecular olefin bond, such as vinylcyclohexene diepoxide, 3,4-epoxycyclohexylmethyl 3,4-epoxycyclohexanecarboxylate, and 2-(3,4-epoxy)cyclohexyl-5,5-spiro(3,4-epoxy)cyclohexane-m-dioxane; glycidyl ethers of para-xylylene and/or meta-xylylene-modified phenolic resins; glycidyl ethers of terpene-modified phenolic resins; glycidyl ethers of dicyclopentadiene-modified phenolic resins; glycidyl ethers of cyclopentadiene-modified phenolic resins; glycidyl ethers of polycyclic aromatic ring-modified phenolic resins; glycidyl ethers of naphthalene ring-containing phenolic resins; halogenated phenol novolac-type epoxy resins; hydroquinone-type epoxy resins; trimethylolpropane-type epoxy resins; linear aliphatic epoxy resins obtained by oxidation of an olefin bond with a peracid such as peracetic acid; diphenyl-methane-type epoxy resins; epoxidation products of aralkyl-type phenolic resins, such as phenol aralkyl resins and naphthol aralkyl resins; sulfur atom-containing epoxy resins; diglycidyl ether of tricyclo[5.2.1.0$^{2,6}$]decanedimethanol; and epoxy resins having an adamantane structure, such as 1,3-bis(1-adamantyl)-4,6-bis(glycidyloyl)benzene, 1-[2', 4'-bis(glycidyloyl)phenyl]adamantane, 1,3-bis(4'-glycidyloylphenyl)adamantane, and 1,3-bis[2',4'-bis(glycidyloyl) phenyl]adamantane.

The compound having two or more epoxy groups in one molecule is preferably a compound that has two or more epoxy groups and an aromatic ring structure and/or an alicyclic structure in one molecule.

When a great importance is placed on the long-term electrical insulation performance of the below-described overcoat film of the present invention, among those compounds that have two or more epoxy groups and an aromatic ring structure and/or an alicyclic structure in one molecule, ones having a tricyclodecane structure and an aromatic ring structure along with two or more epoxy groups, examples of which include glycidyl ethers of dicyclopentadiene-modified phenolic resins (i.e., compounds that have a tricyclo [5.2.1.0$^{2,6}$]decane structure and an aromatic ring structure along with two or more epoxy groups) and epoxy resins having an adamantane structure, such as 1,3-bis(1-adamantyl)-4,6-bis(glycidyloyl)benzene, 1-[2',4'-bis(glycidyloyl) phenyl]adamantane, 1,3-bis(4'-glycidyloylphenyl)adamantane and 1,3-bis[2',4'-bis(glycidyloyl)phenyl]adamantane (i.e., compounds that have a tricyclo[3.3.1.1$^{3,7}$]decane structure and an aromatic ring structure as well as two or more epoxy groups), are preferable since such compounds can yield cured products having low water absorption, and a compound of following formula (34) is particularly preferable.

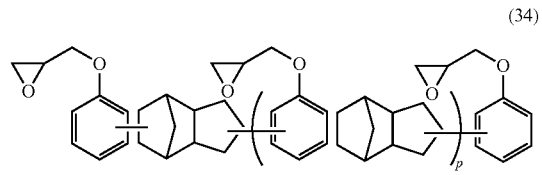

(34)

wherein p presents an integer.

Meanwhile, when a great importance is placed on the reactivity with the polyurethane of the present invention, among those compounds that have two or more epoxy groups and an aromatic ring structure and/or an alicyclic structure in one molecule, ones having an amino group and an aromatic ring structure along with two or more epoxy groups, examples of which include glycidyl-type or methylglycidyl-type epoxy resins, such as those obtained by substitution of an active hydrogen bound to a nitrogen atom of aniline or bis(4-aminophenyl)methane with a glycidyl group and those obtained by substitution of an active hydrogen bound to the nitrogen atom and an active hydrogen of the phenolic hydroxyl group that are contained in an aminophenol (e.g., p-aminophenol) with glycidyl groups, are preferable, and a compound represented by following formula (35) is particularly preferable.

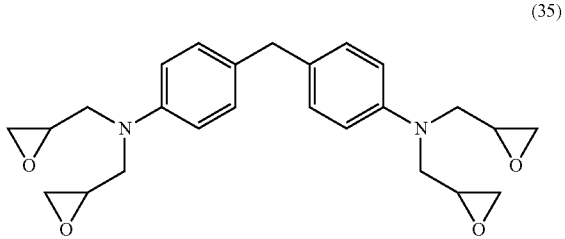 [SMILES: c1cc(N(CC2CO2)CC2CO2)ccc1Cc1ccc(N(CC2CO2)CC2CO2)cc1]

(35)

In the curable composition of the present invention, the amount of component (c) is 1 to 60% by mass, preferably 2 to 50% by mass, more preferably 3 to 40% by mass, based on the total amount of components (a) and (c) contained in the curable composition. When the amount of component (c) in the curable composition of the present invention is in a range of 1 to 60% by mass based on the total amount of components (a) and (c) contained in the curable composition, a good balance between the low warpage and the wiring breakage-inhibiting effect can be attained for a flexible wiring board covered with the below-described overcoat film of the present invention.

Further, in the curable composition of the present invention, the amount of component (a) is 40 to 99% by mass, preferably 50 to 98% by mass, more preferably 60 to 97% by mass, based on the total amount of components (a) and (c) contained in the curable composition. When the amount of component (c) in the curable composition of the present invention is in a range of 40 to 99% by mass based on the total amount of components (a) and (c) contained in the curable composition, a good balance between the low warpage and the wiring breakage-inhibiting effect can be attained for a flexible wiring board covered with the below-described overcoat film of the present invention.

The content of component (b) in the curable composition of the present invention is preferably 25 to 75% by mass, more preferably 35 to 65% by mass, based on the total amount of components (a). (b) and (c) and the below-described component (d) that are constituents of the curable composition of the present invention (or, based on the total amount of components (a), (b) and (c) when the curable composition of the present invention does not contain component (d)). When the content of component (b) is in a range of 25 to 75% by mass, the curable composition has a viscosity favorable for printing by a screen printing method and does not much spread due to bleeding after being screen-printed; therefore, as a result, the actual printing area of the curable composition is kept from being excessively larger than the part desired to be coated with the curable composition (i.e., the shape of a printing plate).

The curable composition of the present invention may further contain following component (d):

(component (d)) at least one particulate selected from the group consisting of an inorganic particulate and organic particulate.

Examples of the inorganic particulate include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3.5SiO_2$), talc ($3MgO.4SiO_2.H_2O$), aluminum titanate ($TiO_2$—$Al_2O_3$), yttria-containing zirconia ($Y_2O_3$—$ZrO_2$), barium silicate ($BaO.8SiO_2$), boron nitride (BN), calcium carbonate ($CaCO_3$), calcium sulfate ($CaSO_4$), zinc oxide (ZnO), magnesium titanate ($MgO.TiO_2$), barium sulfate ($BaSO_4$), organic bentonite, carbon (C), hydrotalcite, and the like, and these may be used singly, or in combination of two or more thereof.

As the organic particulate, particulates of heat-resistant resins having an amide bond, an imide bond, an ester bond or an ether bond are preferable. From the standpoints of heat resistance and mechanical properties, preferable examples of such resins include polyimide resins and precursors thereof; polyamide-imide resins and precursors thereof; and polyamide resins.

Thereamong, component (d) preferably comprises at least one particulate selected from a silica particulate and hydrotalcite particulate.

It is herein defined that the silica particulate used in the curable composition of the present invention encompasses those which are in a powder form and have been physically coated or chemically surface-treated with an organic compound.

The silica particles used in the curable composition of the present invention are not particularly limited as long as they can be dispersed in the curable composition of the present invention to form a paste, and examples thereof include AEROSIL available from Nippon Aerosil Co., Ltd.

Such silica particulates represented by AEROSIL may be used for imparting printability in screen printing and, in that case, the silica particulates are used for the purpose of imparting thixotropy.

Hydrotalcite is a layered inorganic compound that is a type of naturally-occurring clay mineral represented by, for example, $Mg_6Al_2(OH)_{16}CO_3.4H_2O$. Further, a hydrotalcite represented by $Mg_{1-x}Al_x(OH)_2(CO_3)_{x/2}.mH_2O$ or the like can be synthesized as well. In other words, hydrotalcite is an Mg/Al-based layered compound capable of fixing anions such as chloride ions ($Cl^-$) and/or sulfate ions ($SO_4^-$) by ion exchange with interlayer carbonate groups. Taking advantage of this function, hydrotalcite can be used for the purpose of improving the insulation reliability by capturing chloride ions ($Cl^-$) and sulfate ions ($SO_4^-$) that cause migration of copper and tin.

Examples of commercially available hydrotalcite include STABIACE HT-1, STABIACE HT-7 and STABIACE HT-P, which are manufactured by Sakai Chemical Industry Co., Ltd.; and DHT-4A, DHT-4A2 and DHT-4C, which are manufactured by Kyowa Chemical Industry Co., Ltd.

These inorganic particulates and/or organic particulates have a particle size of preferably 0.01 to 10 μm, more preferably 0.1 to 5 μm.

Component (d) is incorporated in an amount of 0.1 to 60% by mass, preferably 0.5 to 40% by mass, more preferably 1 to 20% by mass, based on the total amount of components (a), (b), (c) and (d). When the amount of component (d) is in a range of 0.1 to 60% by mass based on the total amount of components (a), (b), (c) and (d), the curable composition has a viscosity favorable for printing by a screen printing method and thus does not much spread due to bleeding after being screen-printed; therefore, as a result, the actual printing area of the curable composition is kept from being excessively larger than the part desired to be coated with the curable composition (i.e., the shape of a printing plate).

The curable composition of the present invention may further contain an antifoaming agent (i.e., component (e)) for the purpose of eliminating bubbles or suppressing generation of bubbles during printing.

Specific examples of the antifoaming agent used in the curable composition of the present invention include silicone-based antifoaming agents, such as BYK-077 (manufactured by BYK Japan K.K.), SN-DEFOAMER 470 (manufactured by San Nopco Ltd.), TSA750S (manufactured by Momentive Performance Materials Inc.), and SILICONE OIL SH-203 (manufactured by Dow Corning Toray Co., Ltd.); acrylic polymer-based antifoaming agents, such as DAPPO SN-348 (manufactured by San Nopco Ltd.), DAPPO SN-354 (manufactured by San Nopco Ltd.), DAPPO SN-368 (manufactured by San Nopco Ltd.), and DISPARLON 230HF (manufactured by Kusumoto Chemicals, Ltd.); acetylene diol-based antifoaming agent, such as SURFYNOL DF-110D (manufactured by Nissin Chemical Industry Co., Ltd.) and SURFYNOL DF-37 (manufactured by Nissin Chemical Industry Co., Ltd.); and fluorine-containing silicone-based antifoaming agents such as FA-630.

The content of the antifoaming agent is preferably 0.01 to 5 parts by mass, more preferably 0.05 to 4 parts by mass, particularly preferably 0.1 to 3 parts by mass, based on 100 parts by mass of a total of components (a), (b), (c) and (d).

The curable composition of the present invention may further contain a curing accelerator (i.e., component (f)). The curing accelerator is not particularly limited as long as it is a compound that facilitates the reaction between epoxy groups and carboxyl groups, and examples thereof include triazine compounds, such as melamine, acetoguanamine, benzoguanamine, 2,4-diamino-6-methacryloyloxyethyl-s-triazine, 2,4-methacryloyloxyethyl-s-triazine, 2,4-diamino-6-vinyl-s-triazine, and 2,4-diamino-6-vinyl-s-triazine isocyanuric acid adduct; imidazole compounds, such as imidazole, 2-methylimidazole, 2-ethyl-4-methylimidazole, 2-phenylimidazole, 2-undecylimidazole, 2-heptadecylimidazole, 1-benzyl-2-methylimidazole, 2-phenyl-4-methylimidazole, 1-cyanoethyl-2-methylimidazole, 1-cyanoethyl-2-ethyl-4-methylimidazole, 1-aminoethyl-2-ethyl-4-methylimidazole, 1-aminoethyl-2-methylimidazole, 1-(cyanoethylaminoethyl)-2-methylimidazole. N-[2-(2-methyl-1-imidazolyl)ethyl]urea, 1-cyanoethyl-2-undecylimidazole, 1-cyanoethyl-2-methylimidazolium trimellitate, 1-cyanoethyl-2-phenylimidazolium trimellitate, I-cyanoethyl-2-ethyl-4-methylimidazolium trimellitate, 1-cyanoethyl-2-undecylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 1-dodecyl-2-methyl-3-benzylimidazolium chloride, N,N'-bis(2-methyl-1-imidazolylethyl)urea, N,N'-bis(2-methyl-1-imidazolylethyl)adipamide, 2-phenyl-4-methyl-5-hydroxymethylimidazole, 2-phenyl-4,5-dihydroxymethylimidazole, 2-methylimidazole isocyanuric acid adduct, 2-phenylimidazole isocyanuric acid adduct, 2,4-diamino-6-[2'-methylimidazolyl-(1')]-ethyl-s-triazine isocyanuric acid adduct, 2-methyl-4-formylimidazole, 2-ethyl-4-methyl-5-formylimidazole, 2-phenyl-4-methylformylimidazole, 1-benzyl-2-phenylimidazole, 1,2-dimethylimidazole, 1-(2-hydroxyethyl)imidazole, vinylimidazole, 1-methylimidazole, 1-allylimidazole, 2-ethylimidazole, 2-butylimidazole, 2-butyl-5-hydroxymethylimidazole, 2,3-dihydro-1H-pyrrolo[1,2-a]benzimidazole, I-benzyl-2-phenylimidazole hydrobromide, and 1-dodecyl-2-methyl-3-benzylimidazolium chloride; cycloamidine compounds and derivatives thereof, such as diazabicycloalkenes (e.g., 1,5-diazabicyclo(4.3.0)nonene-5 and salts thereof, and 1,8-diazabicyclo(5.4.0)undecene-7 and salts thereof); amine compounds, such as triethylenediamine, benzyldimethylamine, triethanolamine, dimethylaminoethanol, and tris(dimethylaminomethyl)phenol; phosphine compounds, such as triphenylphosphine, diphenyl(p-tolyl)phosphine, tris(alkylphenyl)phosphine, tris(alkoxyphenyl)phosphine, tris(alkylalkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkylphosphine, dialkylarylphosphine, and alkyldiarylphosphine; and dicyandiazide.

These curing accelerators may be used singly, or in combination of two or more thereof.

Among these curing accelerators, from the standpoint of attaining both satisfactory curing acceleration effect and satisfactory electrical insulation performance, melamine, imidazole compounds, cycloamidine compounds, derivatives of cycloamidine compounds, phosphine compounds and amine compounds are preferable, and melamine, 1,5-diazabicyclo(4.3.0)nonene-5 and salts thereof, and 1,8-diazabicyclo(5.4.0)undecene-7 and salts thereof are more preferable.

The amount of the curing accelerator to be added is not particularly limited as long as a curing acceleration effect can be attained. However, from the standpoints of the curability of the curable composition of the present invention as well as the electrical insulation properties and the water resistance of an overcoat film obtained by curing the curable composition of the present invention, the curing accelerator is incorporated in a range of preferably 0.05 to 5 parts by mass, more preferably 0.1 to 3 parts by mass, based on 100 parts by mass of a total of the polyurethane of the present invention (i.e., component (a)) and component (c) that are contained in the curable composition of the present invention. When the amount is in a range of 0.05 to 5 parts by mass based on 100 parts by mass of a total of components (a) and (c), not only the curable composition of the present invention can be cured in a short time, but also an overcoat film obtained by curing the curable composition of the present invention has good electrical insulation properties and water resistance.

In order to allow the curable composition of the present invention to have good screen printing properties and to prevent the curable composition from flowing after being printed and thereby causing the resulting film thickness to be inconsistent, it is desired that the curable composition of the present invention have a thixotropy index at 25° C. of not less than 1.1, more preferably in a range of 1.1 to 3.0, particularly preferably in a range of 1.1 to 2.5. For the purpose of controlling the thixotropy index to be not less than 1.1 at 25° C., for example, a method of adjusting the thixotropy index using the above-described inorganic particulate or organic particulate or a method of adjusting the thixotropy index using a polymer additive may be employed, and a method of adjusting the thixotropy index using the above-described inorganic particulate or organic particulate is more preferably employed.

The term "thixotropy index" used herein is defined as a ratio of the a viscosity measured at a rotation speed of 1 rpm to a viscosity measured at a rotation speed of 10 rpm, wherein the viscosities are measured using a cone/plate-type viscometer (DV-II+Pro, manufactured by Brookfield Engineering Laboratories, Inc.; spindle model: CPE-52) at a temperature of 25° C.

Further, when it is necessary to prevent the resins from being deteriorated by oxidation and discolored by heating, an antioxidant such as a phenolic antioxidant, a phosphite-based antioxidant or a thioether-based antioxidant may be added to the curable composition of the present invention.

Lastly, the overcoat film, the flexible wiring board and the method of producing a flexible wiring board according to the present invention will be described.

The overcoat film of the present invention is a flexible wiring board overcoat film comprising the cured product of the curable composition of the present invention. More particularly, the overcoat film of the present invention is a flexible wiring board overcoat film, which is obtained by coating and curing the curable composition of the present invention on a part or the entirety of a surface of a flexible wiring board including a wiring formed on a flexible substrate, on which surface the wiring is formed.

The flexible wiring board of the present invention is a flexible wiring board comprising a flexible substrate and a wiring formed on the flexible substrate, wherein a part or all of a surface on which the wiring is formed is covered with the above-described overcoat film.

The wiring covered with the overcoat film is preferably a tin-plated copper wiring, taking into consideration the anti-oxidation and economic aspects of the wiring.

The method of producing a flexible wiring board according to the present invention is a method of producing a flexible wiring board covered with an overcoat film, the method comprising following steps 1 to 3:

(step 1) the step of printing the curable composition of the present invention on at least a part of a wiring pattern section of a flexible wiring board to form a printed film on the pattern;

(step 2) the step of placing the printed film obtained in step 1 in an atmosphere of 40 to 100° C. to evaporate a part or all of the solvent contained in the printed film; and (step 3) the step of heating and curing the printed film obtained in step 1 or the printed film obtained in step 2 at 100 to 170° C. to forming an overcoat film.

The curable composition of the present invention can be used as, for example, an ink for an insulating protective overcoat film of a wiring, and the cured product of the present invention can be used as an overcoat film for insulating protection. Particularly, for example, by covering all or a part of the wiring of a flexible wiring board such as a chip-on-film (COF) with the cured product of the curable composition of the present invention, the cured product can be used as an overcoat film for insulating protection of wiring.

Concrete steps performed in the method of producing a flexible wiring board according to the present invention will now be described. For example, an overcoat film of a flexible wiring board can be formed by performing following steps 1 to 3:

(step 1) the step of printing the curable composition of the present invention on at least a part of a wiring pattern section of a flexible wiring board to form a printed film on the pattern;

(step 2) the step of placing the printed film obtained in step 1 in an atmosphere of 40 to 100° C. to evaporate a part or all of the solvent contained in the printed film; and (step 3) the step of heating and curing the printed film obtained in step 1 or the printed film obtained in step 2 at 100 to 170° C. to forming an overcoat film.

The operation of placing the printed film obtained in step 1 in an atmosphere of 40 to 100° C. to evaporate the solvent contained in the printed film, which operation is performed in step 2, is performed at a temperature of usually 40 to 100° C., preferably 60 to 100° C., more preferably 70 to 90° C., taking into consideration the evaporation rate of the solvent and prompt transition to the subsequent operation (heat-curing at 100 to 170° C.). The duration of the operation of placing the printed film obtained in step 1 in an atmosphere of 40 to 100° C. to evaporate the solvent contained in the printed film, which operation is performed in step 2, is not particularly limited; however, it is preferably 10 to 120 minutes, more preferably 20 to 100 minutes.

The operation of placing the printed film obtained in step 1 in an atmosphere of 40 to 100° C. to evaporate the solvent contained in the printed film is performed as required, and step 3 of heating the printed film at 100 to 170° C. may be performed immediately after step 1 so as to perform the curing reaction and the solvent removal at the same time. As for the conditions of the heat-curing performed in this process, from the standpoint of inhibiting diffusion of the resulting plating layer and attaining low warpage and flexibility suitable as a protective film, the heat-curing temperature is preferably 105 to 160° C., more preferably 110 to 150° C. The duration of the heat-curing performed for the formation of an overcoat film is not particularly limited; however, it is preferably 10 to 150 minutes, more preferably 15 to 120 minutes.

By the above-described method, a flexible wiring board including a wiring formed on a flexible substrate, in which a part or all of a surface on which the wiring is formed is covered with the above-described overcoat film, can be obtained.

EXAMPLES

The present invention will now be described more concretely by way of examples thereof; however, the present invention is not limited to the following examples by any means.

<Measurement of Acid Value>

A solvent contained in a polyurethane solution used in the present invention was removed by distillation under reduced pressure with heating to obtain only the polyurethane of the present invention.

For the polyurethane obtained by this method, the acid value was measured in accordance with the potentiometric titration method of JIS K0070.

The apparatus used in the potentiometric titration method was as follows.

Apparatus: automatic potentiometric titrator AT-510, manufactured by Kyoto Electronics Manufacturing Co., Ltd.

Electrode: composite glass electrode C-173, manufactured by Kyoto Electronics Manufacturing Co., Ltd.

<Measurement of Hydroxyl Value>

A solvent contained in a polyurethane solution used in the present invention was removed by distillation under reduced pressure with heating to obtain only the polyurethane of the present invention.

For the polyurethane obtained by this method, the hydroxyl value was measured in accordance with JIS K0070.

For this measurement, the same apparatus as the one used for the above-described measurement of the acid value was used.

<Measurement of Number-Average Molecular Weight of Polyurethane>

The number-average molecular weight was measured by GPC in terms of polystyrene, and the GPC measurement conditions were as follows.

Apparatus: HPLC unit HSS-2000, manufactured by JASCO Corporation

Column: SHODEX Column LF-804

Mobile phase: tetrahydrofuran

Flow rate: 1.0 mL/min

Detector: RI-2031 Plus, manufactured by JASCO Corporation

Temperature: 40.0° C.

Sample amount: Sample Loop 100 μL

Sample concentration: adjusted to be about 0.1% by mass

<Measurement of Viscosity of Polyurethane-Containing Solution>

The viscosity of a polyurethane solution was measured by the following method.

Using a cone/plate-type viscometer (DV-II+Pro, manufactured by Brookfield Engineering Laboratories, Inc.; spindle model: CPE-52), the viscosity of about 0.8 g of the polyurethane solution at 7 minutes after the start of the measurement was determined at a temperature of 25.0° C. and a rotation speed of 5 rpm.

<Measurement of Viscosity of Curable Composition>

The viscosity of a curable composition was measured by the following method.

Using a cone/plate-type viscometer (DV-II+Pro, manufactured by Brookfield Engineering Laboratories, Inc.; spindle model: CPE-52), the viscosity of about 0.8 g of the curable composition at 7 minutes after the start of the measurement was determined at a temperature of 25.0° C. and a rotation speed of 10 rpm.

<Measurement of Thixotropy Index>

The thixotropy index of a curable composition was determined by the following method.

Using a cone/plate-type viscometer (DV-II+Pro, manufactured by Brookfield Engineering Laboratories, Inc.; spindle model: CPE-52), the viscosity of about 0.8 g of the curable composition at 7 minutes after the start of the measurement was determined at a temperature of 25.0° C. and a rotation speed of 10 rpm. Then, the viscosity at 7 minutes after the start of the measurement was determined at a temperature of 25.0° C. and a rotation speed of 1 rpm.

The thixotropy index was calculated in the following manner.

Calculation of thixotropy index:

Thixotropy index=[Viscosity at 1 rpm]÷[Viscosity at 10 rpm]

<Synthesis of Polyester Polyol>

Reference Synthesis Example 1

To a reaction vessel equipped with a stirrer, a thermometer and a condenser having a distillator, 983.5 g (6.74 mol) of phthalic anhydride and 879.2 g (7.44 mol) of 1,6-hexanediol were added, and the inner temperature of the reaction vessel was raised to 140° C. using an oil bath, followed by continuous stirring for 4 hours. Then, while continuously stirring the added materials, 1.74 g of mono-n-butyl tin oxide was further added, and the inner temperature of the reaction vessel was gradually raised A vacuum pump was connected to the reaction vessel, and the pressure inside the reaction vessel was slowly reduced so as to remove water from the reaction vessel by distillation under reduced pressure. Eventually, the inner temperature was raised to 220° C. and the pressure was reduced to 133.32 Pa. The reaction was terminated after 15 hours when water was confirmed to have been completely removed by distillation. The hydroxyl value of the thus obtained polyester polyol (hereinafter referred to as "polyester diol (a)") was measured to be 53.1 mg-KOH/g.

<Synthesis of Polyurethanes>

Synthesis Example 1 (Comparative Example)

To a reaction vessel equipped with a stirrer, a thermometer and a condenser, 10.7 g (24.4 mmol, aromatic ring: 97.6 mmol) of 9,9-bis[4-(2-hydroxyethoxy)phenyl]fluorene, 61.52 g of P-2030 (manufactured by Kuraray Co., Ltd., a polyester polyol composed of isophthalic acid/3-methyl-1,5-pentanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after confirming by an IR analysis that absorption of isocyanato group attributed to C=O stretching vibration was substantially no longer observed, 1.5 g of ethanol (manufactured by Wako Pure Chemical Industries. Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A1") was obtained.

The thus obtained polyurethane solution A1 had a viscosity of 120,000 mPa·s. The carboxyl group-containing polyurethane having an aromatic ring concentration of 3.1 mmol/g (hereinafter referred to as "polyurethane U1"), which was contained in the polyurethane solution A1, had a number-average molecular weight of 20,000 and an acid value of 25.0 mg-KOH/g. FIGS. 1 and 2 illustrate the $^1$H-NMR spectrum (solvent: $CDCl_3$) and the IR spectrum of the polyurethane U1, respectively.

Further, the polyurethane solution A1 had a solid concentration of 40.0% by mass.

Synthesis Example 2 (Inventive Example)

To a reaction vessel equipped with a stirrer, a thermometer and a condenser, 10.7 g of 9,9-bis[4-(2-hydroxyethoxy)phenyl]fluorene, 61.52 g of the above-described polyester diol (a) (polyester polyol composed of o-phthalic acid/1,6-hexanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A2") was obtained.

The thus obtained polyurethane solution A2 had a viscosity of 120,000 mPa·s. The carboxyl group-containing polyurethane having an aromatic ring concentration of 3.1 mmol/g (hereinafter referred to as "polyurethane U2"), which was contained in the polyurethane solution A2, had a number-average molecular weight of 20,000 and an acid value of 25.0 mg-KOH/g. FIGS. 3 and 4 illustrate the $^1$H-NMR spectrum (solvent: $CDCl_3$) and the IR spectrum of the polyurethane U2, respectively.

Further, the polyurethane solution A2 had a solid concentration of 40.0% by mass.

Synthesis Example 3 (Inventive Example)

To a reaction vessel equipped with a stirrer, a thermometer and a condenser, 10.7 g of 9,9-bis[4-(2-hydroxyethoxy)

phenyl]fluorene, 30.76 g of P-2030 (manufactured by Kuraray Co., Ltd., a polyester polyol composed of isophthalic acid/3-methyl-1,5-pentanediol), 30.76 g of the above-described polyester diol (a) (polyester polyol composed of o-phthalic acid/1,6-hexanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A3") was obtained.

The thus obtained polyurethane solution A3 had a viscosity of 120,000 mPa·s. The carboxyl group-containing polyurethane having an aromatic ring concentration of 3.1 mmol/g (hereinafter referred to as "polyurethane U3"), which was contained in the polyurethane solution A3, had a number-average molecular weight of 20,000 and an acid value of 25.0 mg-KOH/g. FIGS. 5 and 6 illustrate the $^1$H-NMR spectrum (solvent: CDCl$_3$) and the IR spectrum of the polyurethane U3, respectively.

Further, the polyurethane solution A3 had a solid concentration of 40.0% by mass.

Synthesis Example 4 (Comparative Example)

To a reaction vessel equipped with a stirrer, a thermometer and a condenser, 10.7 g of 9,9-bis[4-(2-hydroxyethoxy)phenyl]fluorene, 61.52 g of P-2020 (manufactured by Kuraray Co., Ltd., a polyester polyol composed of terephthalic acid/3-methyl-1,5-pentanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A4") was obtained.

The thus obtained polyurethane solution A4 had a viscosity of 120,000 mPa·s. The carboxyl group-containing polyurethane having an aromatic ring concentration of 3.1 mmol/g (hereinafter referred to as "polyurethane U4"), which was contained in the polyurethane solution A4, had a number-average molecular weight of 20,000 and an acid value of 25.0 mg-KOH/g.

Further, the polyurethane solution A4 had a solid concentration of 40.0% by mass.

Synthesis Example 5 (Inventive Example)

To a reaction vessel equipped with a stirrer, a thermometer and a condenser, 10.27 g of 9,9-bis[4-(2-hydroxyethoxy)phenyl]fluorene, 59.09 g of the above-described polyester diol (a) (polyester polyol composed of o-phthalic acid/1,6-hexanediol), 7.78 g of 2,2-dimethylolpropionic acid (manufactured by Tokyo Chemical Industry Co., Ltd.) as a carboxyl group-containing diol, and 137.7 g of r-butyrolactone as a solvent were added, and these materials were heated to 100° C. and thereby completely dissolved.

The temperature of the resulting reaction solution was lowered to 90° C., and 29.87 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.0 mmol/g (hereinafter referred to as "polyurethane solution A5") was obtained.

The thus obtained polyurethane solution A5 had a viscosity of 120,000 mPa·s. The carboxyl group-containing polyurethane having an aromatic ring concentration of 3.0 mmol/g (hereinafter referred to as "polyurethane U5"), which was contained in the polyurethane solution A5, had a number-average molecular weight of 20,000 and an acid value of 30.0 mg-KOH/g.

Further, the polyurethane solution A5 had a solid concentration of 40.0% by mass.

Synthesis Example 6 (Inventive Example)

To a reaction vessel equipped with a stirrer, a thermometer and a condenser, 10.7 g of 9,9-bis[4-(2-hydroxyethoxy)phenyl]fluorene, 61.52 g of the above-described polyester diol (a) (polyester polyol composed of o-phthalic acid/1,6-hexanediol), 7.21 g of 2,2-dimethylolbutanoic acid (manufactured by Tokyo Chemical Industry Co., Ltd.) as a carboxyl group-containing diol, and 138.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.5 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A6") was obtained.

The thus obtained polyurethane solution A6 had a viscosity of 120,000 mPa·s. The carboxyl group-containing polyurethane having an aromatic ring concentration of 3.1 mmol/g (hereinafter referred to as "polyurethane U6"), which was contained in the polyurethane solution A6, had a number-average molecular weight of 20,000 and an acid value of 25.0 mg-KOH/g.

Further, the polyurethane solution A6 had a solid concentration of 40.0% by mass.

Synthesis Example 7 (Inventive Example)

To a reaction vessel equipped with a stirrer, a thermometer and a condenser, 10.00 g of 9,9-bis[4-(2-hydroxyethoxy) phenyl]fluorene, 66.70 g of the above-described polyester diol (α) (polyester polyol composed of o-phthalic acid/1,6-hexanediol), 6.50 g of 2,2-dimethylolpropionic acid (manufactured by Tokyo Chemical Industry Co., Ltd.) as a carboxyl group-containing diol, and 138.0 g of γ-butyrolactone as a solvent were added, and these materials were heated to 100° C. and thereby completely dissolved.

The temperature of the resulting reaction solution was lowered to 90° C., and 24.00 g of isophorone diisocyanate (manufactured by Evonik Industries AG, trade name: IPDI) as a polyisocyanate compound was added dropwise thereto over a period of 30 minutes using a dropping funnel. Reaction was allowed to proceed at 145 to 150° C. for 8 hours and, after substantial disappearance of isocyanate was confirmed, 1.5 g of ethanol (manufactured by Wako Pure Chemical Industries, Ltd.) and 24.4 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.2 mmol/g (hereinafter referred to as "polyurethane solution A7") was obtained.

The thus obtained polyurethane solution A7 had a viscosity of 120,000 mPa·s. The carboxyl group-containing polyurethane having an aromatic ring concentration of 3.2 mmol/g (hereinafter referred to as "polyurethane U7"), which was contained in the polyurethane solution A7, had a number-average molecular weight of 20,000 and an acid value of 25.0 mg-KOH/g. Further, the polyurethane solution A7 had a solid concentration of 40.0% by mass.

Synthesis Example 8 (Comparative Example)

To a reaction vessel equipped with a stirrer, a thermometer and a condenser, 248.0 g of C-1090 (manufactured by Kuraray Co., Ltd., a (poly)carbonate diol obtained using 1,6-hexanediol and 3-methyl-1,5-pentanediol as materials, hydroxyl value: 122.22 mg-KOH/g) as a (poly)carbonate polyol, 47.5 g of 2,2-dimethylolbutanoic acid (manufactured by Nippon Kasei Chemical Co., Ltd.) as a carboxyl group-containing diol, 2.7 g of trimethylolethane (manufactured by Mitsubishi Gas Chemical Company, Inc.) as a polyol other than the (poly)carbonate polyol and carboxyl group-containing diol, and 467.5 g of γ-butyrolactone (manufactured by Mitsubishi Chemical Corporation) and 82.5 g of diethylene glycol diethyl ether (manufactured by Nippon Nyukazai Co., Ltd.) as solvents were added, and these materials were heated to 100° C. and thereby completely dissolved.

The temperature of the resulting reaction solution was lowered to 90° C., and 150.4 g of methylenebis(4-cyclohexylisocyanate) (manufactured by Sumika Bayer Urethane Co., Ltd., trade name: DESMODUR-W) as a diisocyanate compound was added dropwise thereto over a period of 30 minutes using a dropping funnel.

Reaction was allowed to proceed at 120° C. for 8 hours, and substantial disappearance of the diisocyanate compound was confirmed by an infrared absorption spectrum analysis. Thereafter, 1.5 g of ethanol (manufactured by Wako Pure Chemical Industries, Ltd.) was added dropwise to the reaction solution, and reaction was allowed to further proceed at 80° C. for 3 hours, whereby a solution of a polyurethane having a carboxyl group and a carbonate bond (hereinafter referred to as "polyurethane solution A8") was obtained.

The thus obtained polyurethane solution A8 had a viscosity of 145,000 mPa·s at 25° C. The polyurethane having a carboxyl group and a carbonate bond (hereinafter referred to as "polyurethane U8"), which was contained in the polyurethane solution A5, had a number-average molecular weight of 14,000 and an acid value of 40.0 mg-KOH/g. Further, the polyurethane solution A8 had a solid concentration of 45.0% by mass.

Synthesis Example 9 (Comparative Example)

To a reaction vessel equipped with a stirrer, a thermometer and a condenser, 248.0 g of C-1015N (manufactured by Kuraray Co., Ltd., a (poly)carbonate polyol obtained using 1,9-nonanediol and 2-methyl-1,8-octanediol as materials, hydroxyl value: 122.22 mg-KOH/g) as a (poly)carbonate polyol, 47.5 g of 2,2-dimethylolbutanoic acid (manufactured by Nippon Kasei Chemical Co., Ltd.) as a carboxyl group-containing diol, 2.7 g of trimethylolethane (manufactured by Mitsubishi Gas Chemical Company, Inc.) as a polyol other than a (poly)carbonate polyol and a carboxyl group-containing diol, and 467.5 g of γ-butyrolactone (manufactured by Mitsubishi Chemical Corporation) and 82.5 g of diethylene glycol diethyl ether (manufactured by Nippon Nyukazai Co., Ltd.) as solvents were added, and these materials were heated to 100° C. and thereby completely dissolved.

The temperature of the resulting reaction solution was lowered to 90° C., and 150.4 g of methylenebis(4-cyclohexylisocyanate) (manufactured by Sumika Bayer Urethane Co., Ltd., trade name: DESMODUR-W) as a diisocyanate compound was added dropwise thereto over a period of 30 minutes using a dropping funnel.

Reaction was allowed to proceed at 120° C. for 8 hours, and substantial disappearance of the diisocyanate compound was confirmed by an infrared absorption spectrum analysis. Thereafter, 1.5 g of ethanol (manufactured by Wako Pure Chemical Industries, Ltd.) was added dropwise to the reaction solution, and reaction was allowed to further proceed at 80° C. for 3 hours, whereby a solution of a polyurethane having a carboxyl group and a carbonate bond (hereinafter referred to as "polyurethane solution A9") was obtained.

The thus obtained polyurethane solution A9 had a viscosity of 145,000 mPa·s at 25° C. The polyurethane having a carboxyl group and a carbonate bond (hereinafter referred to as "polyurethane U9", which was contained in the polyurethane solution A9, had a number-average molecular weight of 14.000 and an acid value of 40.0 mg-KOH/g. Further, the polyurethane solution A9 had a solid concentration of 45.0% by mass.

The properties of the polyurethanes U1 to U9 are shown in Table 1.

TABLE 1

| Polyurethane | | U1 | U2 | U3 | U4 | U5 | U6 | U7 | U8 | U9 |
|---|---|---|---|---|---|---|---|---|---|---|
| Molecular weight | | 20,000 | 20,000 | 20,000 | 20,000 | 20,000 | 20,000 | 20,000 | 14,000 | 14,000 |
| Acid value | mg-KOH/g | 25 | 25 | 25 | 25 | 30 | 25 | 25 | 40 | 40 |
| Aromatic ring concentration | m-mol/g | 3.1 | 3.1 | 3.1 | 3.1 | 3.0 | 3.1 | 3.2 | — | — |

<Production of Main Agent Blends>

Blending Example 1

Using a three-roll mill (manufactured by Inoue MFG., Inc., type: S-4 3/4×11), 160.0 parts by mass of the polyurethane solution A1, 6.3 parts by mass of silica powder (manufactured by Nippon Aerosil Co., Ltd., trade name: AEROSIL R-974), 0.72 parts by mass of melamine (manufactured by Nissan Chemical Industries, Ltd.) as a curing accelerator, and 8.4 parts by mass of diethylene glycol diethyl ether were mixed to incorporate the silica powder and the curing accelerator into the polyurethane solution A1. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend C1.

Blending Examples 2 to 7

Materials were blended according to the respective formulations shown in Table 2 in the same manner as in Blending Example 1. The blends prepared in Blending Examples 2 to 7 were defined as main agent blends C2 to C7, respectively. It is noted here that the numerical values in the table represent values in "parts by mass."

Blending Example 8

Using a three-roll mill (manufactured by Inoue MFG., Inc., type: S-4 3/4×11), 160.0 parts by mass of the polyurethane solution A1, 6.3 parts by mass of silica powder (manufactured by Nippon Aerosil Co., Ltd., trade name: AEROSIL R-974), 1.0 part by mass of hydrotalcite (manufactured by Kyowa Chemical Industry Co., Ltd., trade name: DHT-4A), 0.72 parts by mass of melamine (manufactured by Nissan Chemical Industries, Ltd.) as a curing accelerator, and 8.4 parts by mass of diethylene glycol diethyl ether were mixed to incorporate the silica powder and the curing accelerator into the polyurethane solution A1. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend C8.

Blending Example 9

Materials were blended according to the formulation shown in Table 2 in the same manner as in Blending Example 1. The blend prepared in Blending Example 9 was defined as a main agent blend C9. It is noted here that the numerical values in the table indicate values in "parts by mass."

Comparative Blending Example 1

Using a three-roll mill (manufactured by Inoue MFG., Inc., type: S-4 3/4×11), 140.0 parts by mass of the polyurethane solution A8, 5.5 parts by mass of silica powder (manufactured by Nippon Aerosil Co., Ltd., trade name: AEROSIL R-974), 0.72 parts by mass of melamine (manufactured by Nissan Chemical Industries, Ltd.) as a curing accelerator, and 8.4 parts by mass of ethylene glycol diethyl ether were mixed to incorporate the silica powder and the curing accelerator into the polyurethane solution A8. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend D1.

Comparative Blending Example 2

Materials were blended according to the formulation shown in Table 2 in the same manner as in Blending Example 1. The blend prepared in Comparative Blending Example 2 was defined as a main agent blend D2. It is noted here that the numerical values in the table indicate values in "parts by mass."

TABLE 2

| | Formulations of Main Agent Blends | | | | | |
|---|---|---|---|---|---|---|
| | Blending Example 1 (main agent blend C1) | Blending Example 2 (main agent blend C2) | Blending Example 3 (main agent blend C3) | Blending Example 4 (main agent blend C4) | Blending Example 5 (main agent blend C5) | Blending Example 6 (main agent blend C6) |
| Polyurethane solution A1 (solid concentration: 40.0%) | 160.0 | | | | | |
| Polyurethane solution A2 (solid concentration: 40.0%) | | 160.0 | | | | |
| Polyurethane solution A3 (solid concentration: 40.0%) | | | 160.0 | | | |
| Polyurethane solution A4 (solid concentration: 40.0%) | | | | 160.0 | | |

TABLE 2-continued

Formulations of Main Agent Blends

| | | | | | | |
|---|---|---|---|---|---|---|
| Polyurethane solution A5 (solid concentration: 40.0%) | | | | | 160.0 | |
| Polyurethane solution A6 (solid concentration: 40.0%) | | | | | | 160.0 |
| Polyurethane solution A7 (solid concentration: 40.0%) | | | | | | |
| Polyurethane solution A8 (solid concentration: 45.0%) | | | | | | |
| Polyurethane solution A9 (solid concentration: 45.0%) | | | | | | |
| Silica powder AEROSIL R-974 | 6.3 | 9.45 | 9.45 | 6.3 | 9.45 | 9.45 |
| Hydrotalcite DHT-4A | | | | | | |
| Diethylene glycol diethyl ether | 8.4 | 8.4 | 8.4 | 8.4 | 8.4 | 8.4 |
| Curing accelerator melamine | 0.72 | 0.72 | 0.72 | 0.72 | 0.72 | 0.72 |
| Antifoaming agent TSA750S | 2.0 | 2.0 | 2.0 | 2.0 | 2.0 | 2.0 |

| | Blending Example 7 (main agent blend C7) | Blending Example 8 (main agent blend C8) | Blending Example 9 (main agent blend C9) | Comparative Blending Example 1 (main agent blend D1) | Comparative Blending Example 2 (main agent blend D2) |
|---|---|---|---|---|---|
| Polyurethane solution A1 (solid concentration: 40.0%) | | 160.0 | | | |
| Polyurethane solution A2 (solid concentration: 40.0%) | | | | | |
| Polyurethane solution A3 (solid concentration: 40.0%) | | | 160.0 | | |
| Polyurethane solution A4 (solid concentration: 40.0%) | | | | | |
| Polyurethane solution A5 (solid concentration: 40.0%) | | | | | |
| Polyurethane solution A6 (solid concentration: 40.0%) | | | | | |
| Polyurethane solution A7 (solid concentration: 40.0%) | 160.0 | | | | |
| Polyurethane solution A8 (solid concentration: 45.0%) | | | | 140.0 | |
| Polyurethane solution A9 (solid concentration: 45.0%) | | | | | 140.0 |
| Silica powder AEROSIL R-974 | 9.45 | 6.3 | 6.3 | 5.5 | 5.5 |
| Hydrotalcite DHT-4A | | 1.0 | 1.0 | | |
| Diethylene glycol diethyl ether | 8.4 | 8.4 | 8.4 | 8.4 | 8.4 |
| Curing accelerator melamine | 0.72 | 0.72 | 0.72 | 0.72 | 0.72 |
| Antifoaming agent TSA750S | 2.0 | 2.0 | 2.0 | 2.0 | 2.0 |

<Production of Curing Agent Solutions>

Curing Agent Solution Blending Example 1

To a vessel equipped with a stirrer, a thermometer and a condenser, 16.85 parts by mass an epoxy resin having a structure represented by the following Formula (35) (manufactured by Mitsubishi Chemical Corporation, grade name: JER604, epoxy equivalent: 120 g/eqv) and 18.25 parts by mass of diethylene glycol diethyl ether were added, and stirring thereof was initiated.

While continuously stirring the materials, the inner temperature of the vessel was raised to 40° C. using an oil bath. After the inner temperature reached 40° C., stirring was continued for another 30 minutes. Thereafter, JER604 was confirmed to have been completely dissolved, and the resulting solution was cooled to room temperature, whereby a JER604-containing solution having a concentration of 48% by mass was obtained. This solution was defined as a curing agent solution E1.

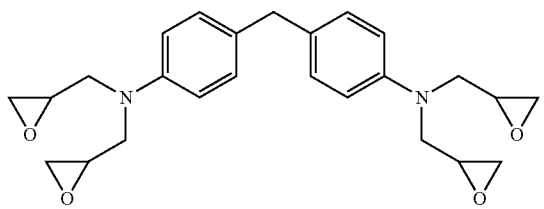

(35)

<Mixing of Main Agent Blend with Curing Agent-Containing Solution>

Curable Composition Blending Example 1

To a plastic container, 88.71 parts by mass of the main agent blend C1 and 3.51 parts by mass of the curing agent solution E1 were added. Further, in order to match the viscosity of the resultant with that of the respective curable compositions of the below-described other Blending Examples and Comparative Blending Examples, 3.0 parts by mass of diethylene glycol diethyl ether and 1.5 parts by mass of diethylene glycol ethyl ether acetate were added as solvents. These materials were mixed at room temperature for 5 minutes by stirring with a spatula, whereby a curable composition (hereinafter referred to as "curable composition F1") was obtained. The thus obtained curable composition F1 had a viscosity of 37.000 mPa·s at 25° C. and a thixotropy index of 1.15.

Curable Composition Blending Examples 2 to 9

Materials were blended according to the respective formulations shown in Table 3 in the same manner as in Curable Composition Blending Example 1. The blends prepared in Curable Composition Blending Examples 2 to 9 were defined as curable compositions F2 to F9, respectively.

Curable Composition Blending Example 10

After mixing 100.0 parts by mass of the polyurethane solution A1, 0.25 parts by mass of 1,5-diazabicyclo(4.3.0) nonene-5 (manufactured by San-Apro Ltd., trade name: DBN) as a curing accelerator, 4.45 parts by mass of the curing agent solution E1 and 2.51 parts by mass of diethylene glycol diethyl ether, 1.0 part by mass of an antifoaming agent (manufactured by Momentive Performance Materials Inc., trade name: TSA750S) was added, and the resultant was mixed using a spatula, whereby a curable composition (hereinafter referred to as "curable composition F10") was obtained. The thus obtained curable composition F10 had a viscosity of 32,000 mPa·s at 25° C. and a thixotropy index of 1.02.

Curable Composition Blending Example 11

A blend was prepared in the same manner as in the above-described "Curable Composition Blending Example 10", except that the polyurethane solution A1 was changed to the polyurethane solution A4, whereby a curable composition (hereinafter referred to as "curable composition F11") was obtained. The thus obtained curable composition F11 had a viscosity of 31,000 mPa·s at 25° C. and a thixotropy index of 1.02.

Comparative Curable Composition Blending Example 1

To a plastic container, 78.62 g of the main agent blend D1 and 5.62 g of the curing agent solution E1 were added. Further, in order to match the viscosity of the resultant with that of the respective curable compositions of the below-described other Blending Examples and Comparative Blending Examples, 4.8 g of diethylene glycol diethyl ether and 1.3 g of diethylene glycol ethyl ether acetate were added as solvents. These materials were mixed at room temperature for 5 minutes by stirring with a spatula, whereby a curable composition (hereinafter referred to as "curable composition G1") was obtained. The thus obtained curable composition G1 had a viscosity of 38,000 mPa·s and a thixotropy index of 1.25.

Comparative Curable Composition Blending Example 2

A blend was prepared in the same manner as in the above-described "Curable Composition Comparative Blending Example 1", except that the main agent blend D1 was changed to the main agent blend D2, whereby a curable composition (hereinafter referred to as "curable composition G2") was obtained. The thus obtained curable composition G2 had a viscosity of 38,000 mPa·s and a thixotropy index of 1.25.

Table 3 shows the formulations of the curable compositions F1 to F11, G1 and G2. Further, Table 4 summarizes the amounts (parts by mass) of the respective components of the curable compositions F1 to F11, G1 and G2.

TABLE 3

| | | Blending Formulations of Curable Compositions | | | | | | |
|---|---|---|---|---|---|---|---|---|
| | Unit | Curable composition F1 | Curable composition F2 | Curable composition F3 | Curable composition F4 | Curable composition F5 | Curable composition F6 | Curable composition F7 |
| Main agent blend C1 | | 88.71 | | | | | | |
| Main agent blend C2 | | | 90.285 | | | | | |
| Main agent blend C3 | | | | 90.285 | | | | |
| Main agent blend C4 | | | | | 88.71 | | | |
| Main agent blend C5 | | | | | | 90.285 | | |
| Main agent blend C6 | | | | | | | 90.285 | |
| Main agent blend C7 | | | | | | | | 90.285 |
| Main agent blend C8 | | | | | | | | |
| Main agent blend C9 | | | | | | | | |
| Polyurethane solution A1 (solid concentration: 40.0%) | | | | | | | | |
| Polyurethane solution A4 (solid concentration: 40.0%) | | | | | | | | |
| Main agent blend D1 | | | | | | | | |
| Main agent blend D2 | | | | | | | | |
| Curing agent solution E1 | | 3.51 | 3.51 | 3.51 | 3.51 | 4.27 | 3.51 | 3.51 |
| Diethylene glycol diethyl ether | | 3.0 | 5.5 | 5.5 | 3.0 | 5.5 | 5.5 | 5.5 |
| Diethylene glycol ethyl ether acetate | | 1.5 | 1.5 | 1.5 | 1.5 | 1.5 | 1.5 | 1.5 |
| 1,5-diazabicyclo(4.3.0) nonene-5 | | | | | | | | |
| Antifoaming agent TSA750S | | | | | | | | |
| Viscosity | mPa·s (25° C.) | 37,000 | 35,000 | 35,000 | 37,000 | 36,000 | 35,000 | 35,000 |

TABLE 3-continued

| Blending Formulations of Curable Compositions | | | | | | | |
|---|---|---|---|---|---|---|---|
| Thixotropy index | 1.15 | 1.23 | 1.23 | 1.15 | 1.23 | 1.23 | 1.23 |
| Number of epoxy groups/number of carboxyl groups | 1.0 | 1.0 | 1.0 | 1.0 | 1.0 | 1.0 | 1.0 |

| | Unit | Curable composition F8 | Curable composition F9 | Curable composition F10 | Curable composition F11 | Curable composition G1 | Curable composition G2 |
|---|---|---|---|---|---|---|---|
| Main agent blend C1 | | | | | | | |
| Main agent blend C2 | | | | | | | |
| Main agent blend C3 | | | | | | | |
| Main agent blend C4 | | | | | | | |
| Main agent blend C5 | | | | | | | |
| Main agent blend C6 | | | | | | | |
| Main agent blend C7 | | | | | | | |
| Main agent blend C8 | | 89.21 | | | | | |
| Main agent blend C9 | | | 89.21 | | | | |
| Polyurethane solution A1 (solid concentration: 40.0%) | | | | 100.0 | | | |
| Polyurethane solution A4 (solid concentration: 40.0%) | | | | | 100.0 | | |
| Main agent blend D1 | | | | | | 78.62 | |
| Main agent blend D2 | | | | | | | 78.62 |
| Curing agent solution E1 | | 3.51 | 3.51 | 4.45 | 4.45 | 5.62 | 5.62 |
| Diethylene glycol diethyl ether | | 3.0 | 3.0 | 2.51 | 2.51 | 4.8 | 4.8 |
| Diethylene glycol ethyl ether acetate | | 1.5 | 1.5 | | | 1.3 | 1.3 |
| 1,5-diazabicyclo(4.3.0) nonene-5 | | | | 0.25 | 0.25 | | |
| Antifoaming agent TSA750S | | | | 1.0 | 1.0 | | |
| Viscosity | mPa·s (25°C.) | 39,000 | 39,000 | 32,000 | 31,000 | 38,000 | 38,000 |
| Thixotropy index | | 1.16 | 1.16 | 1.02 | 1.02 | 1.25 | 1.25 |
| Number of epoxy groups/number of carboxyl groups | | 1.0 | 1.0 | 1.0 | 1.0 | 1.0 | 1.0 |

TABLE 4

| | | | Example 1 | Example 2 | Example 3 | Example 4 | Example 5 | Example 6 | Example 7 |
|---|---|---|---|---|---|---|---|---|---|
| | | | Curable composition used | | | | | | |
| | | Unit | Curable composition F1 | Curable composition F2 | Curable composition F3 | Curable composition F4 | Curable composition F5 | Curable composition F6 | Curable composition F7 |
| Component (a) (Polyurethane according to the present invention) | Polyurethane U1 | parts by mass | 32.1 | | | | | | |
| | Polyurethane U2 | | | 32.1 | | | | | |
| | Polyurethane U3 | | | | 32.1 | | | | |
| | Polyurethane U4 | | | | | 32.1 | | | |
| | Polyurethane U5 | | | | | | 32.1 | | |
| | Polyurethane U6 | | | | | | | 32.1 | |
| | Polyurethane U7 | | | | | | | | 32.1 |
| Polyurethane other than component (a) | Polyurethane U8 | | | | | | | | |
| | Polyurethane U9 | | | | | | | | |
| Component (b) | γ-butyrolactone | parts by mass | 40.7 | 40.7 | 40.7 | 40.7 | 40.7 | 40.7 | 40.7 |
| | Diethylene glycol diethyl ether | | 16.2 | 18.7 | 18.7 | 16.2 | 19.1 | 18.7 | 18.7 |
| | Diethylene glycol ethyl ether acetate | | 1.50 | 1.50 | 1.50 | 1.50 | 1.50 | 1.50 | 1.50 |
| | Total amount of component (b) | | 58.4 | 60.9 | 60.9 | 58.4 | 61.3 | 60.9 | 60.9 |
| Component (c) | jER604 | parts by mass | 1.69 | 1.69 | 1.69 | 1.69 | 2.05 | 1.69 | 1.69 |
| Component (d) | AEROSIL R-974 | parts by mass | 3.15 | 4.73 | 4.73 | 3.15 | 4.73 | 4.73 | 4.73 |
| | Hydrotalcite DHT-4A | | | | | | | | |
| Curing accelerator | Melamine | parts by mass | 0.36 | 0.36 | 0.36 | 0.36 | 0.36 | 0.36 | 0.36 |
| | 1,5-diazabicyclo(4.3.0) nonene-5 | | | | | | | | |

TABLE 4-continued

| | | | | | | | | |
|---|---|---|---|---|---|---|---|---|
| Antifoaming agent | TSA750S | parts by mass | 1.0 | 1.0 | 1.0 | 1.0 | 1.0 | 1.0 | 1.0 |
| Viscosity | | mPa·s (25° C.) | 37,000 | 35,000 | 35,000 | 37,000 | 36,000 | 35,000 | 35,000 |
| Thixotropy index | | | 1.15 | 1.23 | 1.23 | 1.15 | 1.23 | 1.23 | 1.23 |
| Carboxyl group/epoxy group | | | 1.0 | 1.0 | 1.0 | 1.0 | 1.0 | 1.0 | 1.0 |

| | | | | Example 8 | Example 9 | Example 10 | Example 11 | Comparative Example 1 | Comparative Example 2 |
|---|---|---|---|---|---|---|---|---|---|
| | | | | | | Curable composition used | | | |
| | | | Unit | Curable composition F8 | Curable composition F9 | Curable composition F10 | Curable composition F11 | Curable composition G1 | Curable composition G2 |
| Component (a) (Polyurethane according to the present invention) | Polyurethane U1 | parts by mass | | 32.1 | | 40.1 | | | |
| | Polyurethane U2 | | | | | | | | |
| | Polyurethane U3 | | | | 32.1 | | | | |
| | Polyurethane U4 | | | | | | 40.1 | | |
| | Polyurethane U5 | | | | | | | | |
| | Polyurethane U6 | | | | | | | | |
| | Polyurethane U7 | | | | | | | | |
| Polyurethane other than component (a) | Polyurethane U8 | | | | | | | 31.6 | |
| | Polyurethane U9 | | | | | | | | 31.6 |
| Component (b) | γ-butyrolactone | parts by mass | | 40.7 | 40.7 | 50.9 | 50.9 | 32.9 | 32.9 |
| | Diethylene glycol diethyl ether | | | 16.2 | 16.2 | 13.1 | 13.1 | 17.7 | 17.7 |
| | Diethylene glycol ethyl ether acetate | | | 1.50 | 1.50 | 0 | 0 | 1.30 | 1.30 |
| | Total amount of component (b) | | | 58.4 | 58.4 | 64.0 | 64.0 | 51.9 | 51.9 |
| Component (c) | jER604 | parts by mass | | 1.69 | 1.69 | 2.14 | 2.14 | 2.70 | 2.70 |
| Component (d) | AEROSIL R-974 | parts by mass | | 3.15 | 3.15 | 2.31 | 2.31 | 2.76 | 2.76 |
| | Hydrotalcite DHT-4A | | | 0.50 | 0.50 | | | | |
| Curing accelerator | Melamine | parts by mass | | 0.36 | 0.36 | | | 0.36 | 0.36 |
| | 1,5-diazabicyclo(4.3.0)nonene-5 | | | | | 0.25 | 0.25 | | |
| Antifoaming agent | TSA750S | parts by mass | | 1.0 | 1.0 | 1.0 | 1.0 | 1.0 | 1.0 |
| Viscosity | | mPa·s (25° C.) | | 39,000 | 39,000 | 32,000 | 31,000 | 38,000 | 38,000 |
| Thixotropy index | | | | 1.16 | 1.16 | 1.02 | 1.02 | 1.25 | 1.25 |
| Carboxyl group/epoxy group | | | | 1.0 | 1.0 | 1.0 | 1.0 | 1.0 | 1.0 |

Examples 1 to 11, and Comparative Examples 1 and 2

Using the curable compositions F1 to F, 11, G1 and G2, the flexibility, the wiring breakage inhibition, the warpage and the long-term electrical insulation reliability were evaluated by the below-described respective methods. The results thereof are shown in Table 5.

<Evaluation of Flexibility>

On the coper of a flexible copper-clad laminate (manufactured by Sumitomo Metal Mining Co., Ltd., grade name: S'PERFLEX, copper thickness: 8 μm, polyimide thickness: 38 μm), the curable composition F1 was screen-printed at a width of 75 mm and a length of 110 mm such that the resulting coating film had a post-curing thickness of 15 μm, and this laminate was maintained at room temperature for 10 minutes and subsequently placed in a 120° C. hot air circulation-type dryer for 60 minutes to cure the curable composition F1. An undercoat PET film of the thus prepared test piece was peeled off, and the test piece was cut into the form of a 10-mm wide strip using a utility knife, after which this strip was bent about 180 degrees such that the coating film surface faced outside, and the resultant was compressed at 0.5±0.2 MPa for 3 seconds using a compressor. The bent portion in a bent state was observed under a microscope at a magnification of ×30, and the presence or absence of cracks was examined. The results thereof are shown in Table 3.

Further, the same evaluation was performed using the curable compositions F2 to F11, G1 and G2. The results thereof are also shown in Table 5.

<Evaluation of Inhibition of Wiring Breakage of Wiring Board (MIT Test)>

On a flexible wiring board prepared by tin-plating a substrate that was produced by etching a flexible copper-clad laminate (manufactured by Sumitomo Metal Mining Co., Ltd., grade name: S'PERFLEX US, copper thickness: 8 μm, polyimide thickness: 38 μm) and had a fine comb-like pattern shape described in JPCA-ET01 (copper line width/copper line width=15 μm/15 μm), the curable composition F1 was screen-printed such that the resulting coating film had a thickness (after drying) of 10 μm from the polyimide surface. The thus obtained wiring board having a coating film formed thereon was placed in an 80° C. hot air circulation-type dryer for 30 minutes and then in a 120° C. hot air circulation-type dryer for 120 minutes, whereby the coating film was cured.

The thus obtained test piece was tested in accordance with JIS C-5016 under the following test conditions.
(Test Conditions)
Tester: MIT Tester BE202, manufactured by Tester Sangyo Co., Ltd.
Folding rate: 10 times/min
Load: 200 g
Folding angle: ±90°
Radius of chuck tip: 0.5 mm The number of folding operations was gradually increased by 10 times at a time under the above-described test conditions, and the presence or absence of a wiring crack was visually observed, recording the number of folding operations when a crack was generated. The results thereof are shown in Table 3.

Further, the same evaluation was performed using the curable compositions F2 to F11, G1 and G2. The results thereof are also shown in Table 5.
<Evaluation of Warpage>

The curable composition F1 was screen-printed on a substrate using a #180-mesh polyester screen, and this substrate was placed in an 80° C. hot air circulation-type dryer for 30 minutes. Then, the substrate was placed in a 120° C. hot air circulation-type dryer for 60 minutes to cure the printed curable composition F1. As the substrate, a 25 μm-thick polyimide film [KAPTON (registered trademark) 100EN, manufactured by DuPont-Toray Co., Ltd.] was used.

The coating film thus obtained by printing the curable composition and then curing the composition in the hot air circulation-type dryer was cut to a size of 50 mmφ using a circle cutter. The vicinity of the center of the coating film thus cut into a circular shape displayed warping deformation in a convex or concave shape. After one hour, the substrate having the cured film formed thereon that was cut by the circle cutter was set still with the convex side facing down i.e., in such a manner that the vicinity of the center of the cured film formed on the substrate was brought into contact with a horizontal surface. Then, the maximum and minimum values of the warpage height from the horizontal surface were measured, and the average value thereof was calculated. Plus/minus signs each represent the direction of warpage and, when a sample was set still with the convex side facing down, a case where the cured film was positioned on the upper side of the copper substrate or the polyimide film was assigned with "+", whereas a case where the cured film was positioned on the lower side was assigned with "−". A warpage of less than +3.0 mm was regarded as satisfactory.

The results thereof are shown in Table 5.

Further, the same evaluation was performed using the curable compositions F2 to F11, G1 and G2. The results thereof are also shown in Table 5.
<Evaluation of Long-Term Electrical Insulation Reliability>

On a flexible wiring board prepared by tin-plating a substrate that was produced by etching a flexible copper-clad laminate (manufactured by Sumitomo Metal Mining Co., Ltd., grade name: S'PERFLEX US, copper thickness: 8 μm, polyimide thickness: 38 μm) and had a fine comb-like pattern shape described in JPCA-ET01 (copper line width/copper line width=15 μm/15 μm), the curable composition F1 was screen-printed such that the resulting film had a thickness (after drying) of 15 μm from the polyimide surface. This flexible wiring board was placed in an 80° C. hot air circulation-type dryer for 30 minutes and then in a 120° C. hot air circulation-type dryer for 120 minutes, whereby the printed curable composition F1 was cured.

A bias voltage of 60 V was applied to the thus obtained test piece, and a constant temperature and humidity test was performed on the test piece at a temperature of 120° C. and a humidity of 85% RH using MIGRATION TESTER MODEL MIG-8600 (manufactured by IMV Corporation). The results of measuring the resistance value of the substrate having the fine comb-like pattern shape at the start of the constant temperature and humidity test as well as at 100 hours, 250 hours and 400 hours after the start of the test are shown in Table 5.

Further, the same evaluation was performed using the curable compositions F2 to F11, G1 and G2. The results thereof are also shown in Table 5.

TABLE 5

| | | Example 1 | Example 2 | Example 3 | Example 4 | Example 5 | Example 6 | Example 7 |
|---|---|---|---|---|---|---|---|---|
| | | Curable composition used | | | | | | |
| | Unit | Curable composition F1 | Curable composition F2 | Curable composition F3 | Curable composition F4 | Curable composition F5 | Curable composition F6 | Curable composition F7 |
| Thickness of cured product | μm | 5 | 5 | 5 | 5 | 5 | 5 | 5 |
| Evaluation of flexibility | | no crack generation | no crack generation | no crack generation | no crack generation | no crack generation | no crack generation | no crack generation |
| Evaluation of inhibition of wiring breakage of wiring board (MIT Test) | times | 220 | 220 | 220 | 190 | 230 | 220 | 220 |
| Evaluation of warpage | | satisfactory (+2.0 mm) | satisfactory (+2.0 mm) | satisfactory (+2.2 mm) | satisfactory (+2.8 mm) | satisfactory (+2.5 mm) | satisfactory (+2.0 mm) | satisfactory (+1.9 mm) |
| Evaluation of long-term insulation reliability | at the start Ω | $6 \times 10^8$ | $3 \times 10^8$ | $6 \times 10^8$ | $3 \times 10^8$ | $3 \times 10^8$ | $3 \times 10^8$ | $2 \times 10^8$ |
| | 100 hours after the start | $4 \times 10^8$ | $6 \times 10^8$ | $5 \times 10^8$ | $6 \times 10^8$ | $6 \times 10^8$ | $6 \times 10^8$ | $4 \times 10^8$ |
| | 250 hours after the start | $2 \times 10^8$ | $6 \times 10^8$ | $4 \times 10^8$ | $6 \times 10^8$ | $6 \times 10^8$ | $6 \times 10^8$ | $4 \times 10^8$ |
| | 400 hours after the start | $1 \times 10^8$ | $5 \times 10^8$ | $2 \times 10^8$ | $5 \times 10^8$ | $5 \times 10^8$ | $5 \times 10^8$ | $3 \times 10^8$ |

TABLE 5-continued

|  | Unit | Example 8 Curable composition F8 | Example 9 Curable composition F9 | Example 10 Curable composition F10 | Example 11 Curable composition F11 | Comparative Example 1 Curable composition G1 | Comparative Example 2 Curable composition G2 |
|---|---|---|---|---|---|---|---|
| Thickness of cured product | μm | 5 | 5 | 4 | 4 | 8 | 8 |
| Evaluation of flexibility | | no crack generation | no crack generation | no crack generation | no crack generation | no crack generation | no crack generation |
| Evaluation of inhibition of wiring breakage of wiring board (MIT Test) | times | 210 | 210 | 180 | 170 | 110 | 120 |
| Evaluation of warpage | | satisfactory (+2.2 mm) | satisfactory (+2.4 mm) | satisfactory (+1.3 mm) | satisfactory (+2.7 mm) | satisfactory (+1.2 mm) | satisfactory (+1.2 mm) |
| Evaluation of long-term insulation reliability | at the start  Ω | $6 \times 10^8$ | $6 \times 10^8$ | $3 \times 10^8$ | $3 \times 10^8$ | $4 \times 10^8$ | $4 \times 10^8$ |
| | 100 hours after the start | $4 \times 10^8$ | $5 \times 10^8$ | $3 \times 10^8$ | $6 \times 10^8$ | $3 \times 10^8$ | $3 \times 10^8$ |
| | 250 hours after the start | $3 \times 10^8$ | $4 \times 10^8$ | $2 \times 10^8$ | $6 \times 10^8$ | $2 \times 10^8$ | $2 \times 10^8$ |
| | 400 hours after the start | $2 \times 10^8$ | $3 \times 10^8$ | $1 \times 10^8$ | $5 \times 10^8$ | $1 \times 10^8$ | $1 \times 10^8$ |

According to the results of Table 5, the curable composition of the present invention exhibits excellent flexibility, wiring breakage inhibition and long-term electrical insulation reliability, and a cured product thereof is thus useful as an insulating protective film for flexible wiring boards.

INDUSTRIAL APPLICABILITY

The polyurethane and the curable composition according to the present invention can be suitably utilized for insulation and protection of flexible wiring boards.

The invention claimed is:

1. A curable composition, comprising:
(component (a)) a polyurethane having
a structural unit of formula (1)

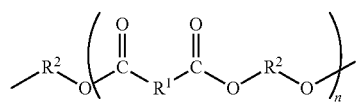

wherein n $R^1$s each independently represent a 1,2-phenylene group or a 1,2-phenylene group having a substituent; (n+1) $R^2$s each independently represent a divalent hydrocarbon group having 3 to 9 carbon atoms; and n represents an integer of 1 to 50;
a structural unit of formula (2)

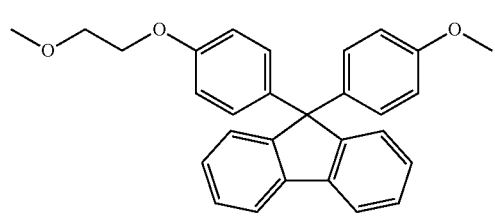

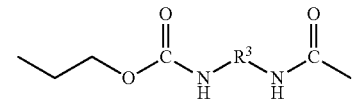

wherein $R^3$ represents a divalent organic group having 6 to 14 carbon atoms; and a structural unit of formula (3)

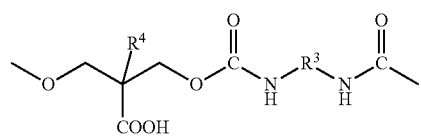

wherein $R^3$ represents a divalent organic group having 6 to 14 carbon atoms; and $R^4$ represents a methyl group or an ethyl group, wherein the polyurethane has an aromatic ring concentration of 0.1 to 5.0 mmol/g, and wherein the polyurethane does not contain a structural unit derived from a polyester polyol having a 1,3-phenylene group;

(component (b)) a solvent; and (component (c)) a compound having two or more epoxy groups in one molecule.

2. A curable composition, comprising:

(component (a)) a polyurethane having an aromatic ring concentration of 0.1 to 5.0 mmol/g and a number-average molecular weight of 10,000 to 50,000, which is composed of a structural unit of formula (4)

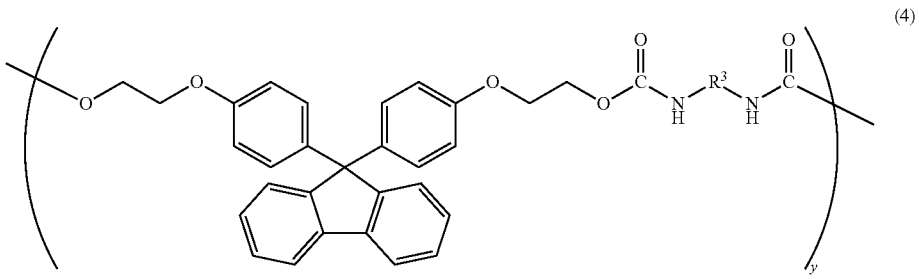

wherein y R³s each independently represent a divalent organic group having 6 to 14 carbon atoms; and y represents an integer of not less than one;

a structural unit of formula (5)

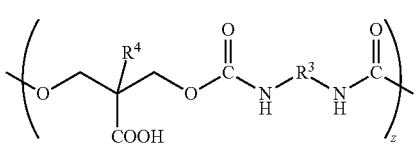

wherein z R³s each independently represent a divalent organic group having 6 to 14 carbon atoms; z R⁴s each independently represent a methyl group or an ethyl group; and z represents an integer of not less than one; and a structural unit of formula (6)

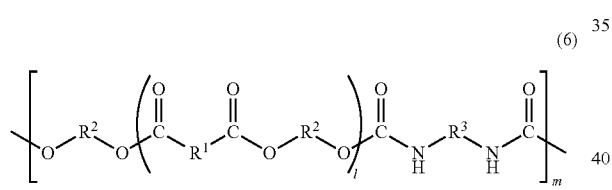

wherein (l× m) R¹s each independently represent a phenylene group or a phenylene group having a substituent, provided that at least one of (l× m) R¹s is a 1,2-phenylene group; [(l+1)×m] R²s each independently represent a hydrocarbon group having 3 to 9 carbon atoms; m R³s each independently represent a divalent organic group having 6 to 14 carbon atoms; m represents an integer of not less than one; and l independently represents an integer of 0 to 50, excluding a case where all of the m ls are 0;

wherein the polyurethane does not contain a structural unit derived from a polyester polyol having a 1,3-phenylene group;

(component (b)) a solvent and (component (c)) a compound having two or more epoxy groups in one molecule.

3. The curable composition according to claim 1, wherein component (a) has an acid value of 10 to 70 mg-KOH/g.

4. A curable composition comprising (component (a)) a polyurethane having a structural unit of formula (1')

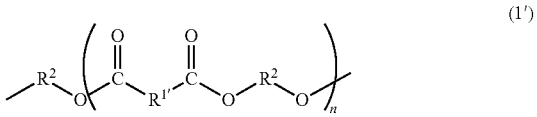

wherein n R¹'s each independently represent a phenylene group or a phenylene group having a substituent, provided that at least one of n R¹'s is a 1,2-phenylene group; (n+1) R²s each independently represent a divalent hydrocarbon group having 3 to 9 carbon atoms; and n represents an integer of 1 to 50;

a structural unit of formula (2)

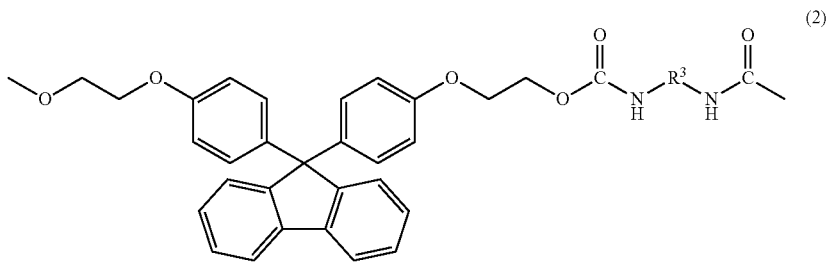

wherein R³ represents a divalent organic group having 6 to 14 carbon atoms; and a structural unit of formula (3)

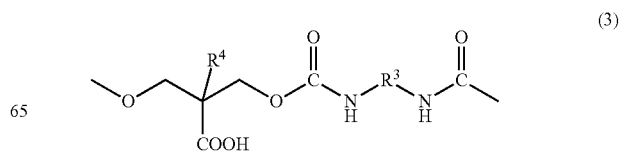

wherein R³ represents a divalent organic group having 6 to 14 carbon atoms; and R⁴ represents a methyl group or an ethyl group, wherein the polyurethane has an aromatic ring concentration of 0.1 to 5.0 mmol/g, and wherein the polyurethane does not contain a structural unit derived from a polyester polyol having a 1,3-phenylene group;

(component (b)) a solvent; and (component (c)) a compound having two or more epoxy groups in one molecule.

5. The curable composition according to claim 4, wherein
the amount of component (b) is 25 to 75% by mass based on the total amount of components (a), (b) and (c), and
the amount of component (a) is 40 to 99% by mass and the amount of component (c) is 1 to 60% by mass, based on the total amount of components (a) and (c).

6. The curable composition according to claim 4, further comprising
(component (d)) at least one particulate selected from the group consisting of an inorganic particulate and organic particulate.

7. The curable composition according to claim 6, wherein component (d) comprises a silica particulate.

8. The curable composition according to claim 6, wherein component (d) comprises a hydrotalcite particulate.

9. The curable composition according to claim 6, wherein
the amount of component (b) is 25 to 75% by mass and the amount of component (d) is 0.1 to 60% by mass, based on the total amount of components (a), (b), (c) and (d), and
the amount of component (a) is 40 to 99% by mass and the amount of component (c) is 1 to 60% by mass, based on the total amount of components (a) and (c).

10. A cured product of the curable composition according to claim 4.

11. A flexible wiring board overcoat film comprising the cured product according to claim 10.

12. A flexible wiring board comprising a flexible substrate and a wiring formed on the flexible substrate, wherein a part or all of a surface on which the wiring is formed is covered with the overcoat film according to claim 11.

13. The flexible wiring board according to claim 12, wherein the wiring is a tin-plated copper wiring.

14. A method of producing a flexible wiring board covered with an overcoat film, comprising
(step 1) the step of printing the curable composition according to claim 4 on at least a part of a wiring pattern section of a flexible wiring board to form a printed film on the pattern;
(step 2) the step of placing the printed film obtained in step 1 in an atmosphere of 40 to 100° C. to evaporate a part or all of the solvent contained in the printed film; and
(step 3) the step of heating and curing the printed film obtained in step 1 or the printed film obtained in step 2 at 100 to 170° C. to form an overcoat film.

15. The curable composition according to claim 2, wherein component (a) has an acid value of 10 to 70 mg-KOH/g.

16. The curable composition according to claim 7, wherein
the amount of component (b) is 25 to 75% by mass and the amount of component (d) is 0.1 to 60% by mass, based on the total amount of components (a), (b), (c) and (d), and
the amount of component (a) is 40 to 99% by mass and the amount of component (c) is 1 to 60% by mass, based on the total amount of components (a) and (c).

17. The curable composition according to claim 8, wherein
the amount of component (b) is 25 to 75% by mass and the amount of component (d) is 0.1 to 60% by mass, based on the total amount of components (a), (b), (c) and (d), and
the amount of component (a) is 40 to 99% by mass and the amount of component (c) is 1 to 60% by mass, based on the total amount of components (a) and (c).

18. The curable composition according to claim 1, further comprising
(component (d)) at least one particulate selected from the group consisting of an inorganic particulate and organic particulate.

19. The curable composition according to claim 2, further comprising
(component (d)) at least one particulate selected from the group consisting of an inorganic particulate and organic particulate.

* * * * *